US012787350B2

(12) United States Patent
Ling et al.

(10) Patent No.: US 12,787,350 B2
(45) Date of Patent: Nov. 3, 2026

(54) SEMICONDUCTOR STRUCTURES INCLUDING CONDUCTING STRUCTURE AND METHODS FOR MAKING THE SAME

(71) Applicant: Peiching Ling, Taipei (TW)

(72) Inventors: Peiching Ling, San Jose, CA (US); Nanray Wu, San Jose, CA (US)

(73) Assignee: Peiching Ling, San Jose, CA (US)

( * ) Notice: Subject to any disclaimer, the term of this patent is extended or adjusted under 35 U.S.C. 154(b) by 703 days.

(21) Appl. No.: 18/051,861

(22) Filed: Nov. 1, 2022

(65) Prior Publication Data

US 2024/0145593 A1 May 2, 2024

(51) Int. Cl.

*H10D 62/10* (2025.01)
*H10D 30/63* (2025.01)
*H10D 86/00* (2025.01)
*H10P 90/00* (2026.01)
*H10W 10/10* (2026.01)

(52) U.S. Cl.

CPC ......... *H10D 30/637* (2025.01); *H10D 62/102* (2025.01); *H10D 86/201* (2025.01); *H10P 90/1916* (2026.01); *H10W 10/181* (2026.01)

(58) Field of Classification Search

None
See application file for complete search history.

(56) References Cited

U.S. PATENT DOCUMENTS

2007/0034944 A1* 2/2007 Xu ........................ H10D 30/603 257/E29.268
2011/0169082 A1* 7/2011 Zhu ........................ H10D 86/00 438/151
2012/0161236 A1* 6/2012 Huang ............... H10D 30/0227 257/355
2014/0252470 A1* 9/2014 Chen .................... H10D 62/107 438/234
2014/0284701 A1* 9/2014 Korec .................. H10D 30/657 438/155
2015/0078061 A1* 3/2015 Shirahama ............. G11C 17/08 365/103

* cited by examiner

*Primary Examiner* — Xiaoming Liu
(74) *Attorney, Agent, or Firm* — Huan-Yi Lin

(57) ABSTRACT

The present disclosure relates to semiconductor structures and methods for making the same. The semiconductor structure comprises a first insulation layer, a first semiconductor layer, and a conducting structure. The first semiconductor layer is over the first insulation layer. The first semiconductor layer comprises a first transistor. The first transistor comprises a first source region, a first drain region, and a first channel region under a first gate disposed over the first semiconductor layer. The conducting structure is disposed under the first channel region and spaced apart from the first drain region. The conducting structure is disposed over the first insulation layer and either within or in contact with the first semiconductor layer.

32 Claims, 36 Drawing Sheets

SEMICONDUCTOR STRUCTURES INCLUDING CONDUCTING STRUCTURE AND METHODS FOR MAKING THE SAME

FIELD OF THE INVENTION

The technical field generally relates to semiconductor structures and methods for making the same; more particularly, to semiconductor structures for reducing floating body effect.

DESCRIPTION OF RELATED ART

A metal oxide semiconductor field effect transistor (MOSFET) built on a silicon-on-insulator (SOI) substrate typically has several important advantages over a MOSFET built on bulk or epitaxial starting substrate. For example, an SOI MOSFET may have a higher on-current and lower parasitic capacitance between the body and other MOSFET components. Therefore, the SOI MOSFET may be ideal for integrated circuits with high speed, high package density, low voltage, and/or low power operation.

However, the body of an SOI MOSFET stores charge which is dependent on the history of the device, hence becoming a "floating" body. As such, SOI MOSFETs exhibit threshold voltages which varies in time and are difficult to anticipate and control. The body charge storage effects may result in dynamic sub-threshold voltage leakage and threshold voltage mismatch among geometrically identical adjacent devices.

SUMMARY

According to the present invention, a semiconductor structure is provided. The semiconductor structure comprises a first insulation layer, a first semiconductor layer, and a conducting structure. The first semiconductor layer is over the first insulation layer. The first semiconductor layer comprises a first transistor. The first transistor comprises a first source region, a first drain region, and a first channel region under a first gate disposed over the first semiconductor layer. The conducting structure is disposed under the first channel region and spaced apart from the first drain region. The conducting structure is disposed over the first insulation layer and either within or in contact with the first semiconductor layer.

In one embodiment, the first semiconductor layer further comprises a second transistor. The second transistor comprises a second source region, a second drain region, and a second channel region under a second gate disposed over the first semiconductor layer. The conducting structure is disposed under the first channel region and the second channel region and spaced apart from the first drain region and the second drain region. The conducting structure is disposed over the first insulation layer and either within or in contact with the first semiconductor layer.

In one embodiment, the first transistor and the second transistor are partially depleted transistors.

In one embodiment, the conducting structure is spaced apart from the first source region and the second source region.

In one embodiment, the conducting structure is either in contact with or partially overlapped with the first source region and the second source region.

In one embodiment, the first gate extends in a first direction, and the first transistor and the second transistor are arranged alongside in a second direction perpendicular to the first direction. The conducting structure comprises a conducting line portion extending in the second direction.

In one embodiment, the conducting structure comprises metal and is in contact with the first semiconductor layer.

In one embodiment, the conducting structure has a first via portion and a second via portion to be in contact with the first semiconductor layer respectively under the first channel region and the second channel region.

In one embodiment, the conducting structure comprises heavily doped semiconductor and is within the first semiconductor layer.

In one embodiment, the first source region includes a first type of dopant, the first channel region includes a second type of dopant different from the first type of dopant, and the conducting structure includes the second type of dopant.

In one embodiment, a doping concentration of the conducting structure is higher than a doping concentration of the first channel region.

In one embodiment, the first channel region further comprises a body region and a depletion region between the body region and the first drain region, and the conducting structure is spaced apart from the depletion region when the first transistor is at zero bias.

In one embodiment, the first semiconductor layer is spaced apart from the first insulation layer.

In one embodiment, the semiconductor structure further comprises a second semiconductor layer, wherein the first insulation layer is between the first semiconductor layer and the second semiconductor layer.

In one embodiment, a thickness of the first semiconductor layer is in a range between 5 nm and 200 nm.

In one embodiment, the first gate extends in a first direction, and the conducting structure comprises a conducting line portion extending in the first direction.

In one embodiment, the conducting line portion is in contact with the first semiconductor layer.

According to the present invention, a method for making a semiconductor structure is provided. The method comprises providing a first structure comprising a first substrate, a first insulation layer on the first substrate, and a conducting structure either within or in contact with the first substrate (step (a)). The method comprises providing a second structure comprising a second substrate (step (b)). The method comprises bonding the first structure on the second structure by the first insulation layer to form a bonded structure (step (c)). The method comprises removing a portion of the first substrate (step (d)) and forming a first transistor in the first substrate (step (e)).

In one embodiment, the first substrate is a single crystalline substrate made of silicon, germanium, gallium arsenide (GaAs), indium phosphide (InP), silicon carbon (SiC), or gallium nitride (GaN).

In one embodiment, the conducting structure comprises metal and is in contact with the first substrate.

In one embodiment, the conducting structure is between the first insulation layer and the first substrate.

In one embodiment, the conducting structure comprises heavily doped semiconductor and is within the first substrate.

In one embodiment, the first insulation layer is in contact with the first substrate.

In one embodiment, in step (d), the portion of the first substrate is removed by (1) heating the bonded structure at a first temperature, (2) cleaving the bonded structure by a mechanical pressure, or (3) quenching the bonded structure with liquid nitrogen.

In one embodiment, the step (e) further comprises polishing the top surface of the first substrate after removing a portion of the first substrate.

In one embodiment, in step (e), the first transistor comprises a first source region, a first drain region, and a first channel region.

In one embodiment, in step (e), the conducting structure is spaced apart from the first drain region.

In one embodiment, the conducting structure comprises metal, and in step (e), the conducting structure is in contact with the first source region.

In one embodiment, the conducting structure comprises heavily doped semiconductor, and in step (e) the conducting structure is overlapped with the first source region.

In one embodiment, the step (a) comprises providing a first substrate (step (a1)), implanting a hydrogen layer into the first substrate (step (a2)), forming the conducting structure on the first substrate (step (a3)), and forming the first insulation layer on the conducting structure (step (a4)).

In one embodiment, the step (a4) comprises depositing the first insulation layer on the conducting structure.

In one embodiment, the step (a) comprises providing a first substrate (step (a1)), forming the conducting structure in the first substrate (step (a2)), implanting a hydrogen layer into the first substrate (step (a3)), and forming the first insulation layer on the first substrate (step (a4)).

In one embodiment, the step (a2) comprises implanting a second type of dopant into a first region of the first substrate.

In one embodiment, the step (a2) comprises annealing the first substrate after implanting the second type of dopant into the first region of the first substrate.

In one embodiment, the step (a4) comprises depositing the first insulation layer on the conducting structure.

According to the present invention, a method for making a semiconductor structure is provided. The method comprises providing a first structure (step (a)). The first structure comprises a first substrate, a second substrate, and a first insulation layer between the first substrate and the second substrate. The method comprises providing second structure comprising a third substrate (step (b)). The method comprises (c) bonding the first structure on the second structure by a bonding layer to form a bonded structure (step (c)), removing the second substrate (step (d)), and (e) forming a conducting structure either within or in contact with the first substrate (step (e)).

In one embodiment, the first structure is formed from a silicon-on-insulator (SOI) substrate, a silicon-metal-on-insulator (SMOI) substrate, a silicon-etch-stopper-on-insulator (SEOI), or a silicon-metal-etch-stopper-on-insulator (SMEOI) substrate.

In one embodiment, the first substrate contains a first transistor comprising a first source region, a first drain region, and a first channel region before the step (c).

In one embodiment, the bonding layer is formed on the first structure before step (c).

In one embodiment, the first structure further comprises interconnect structure over the first substrate, and in step (c) the interconnect structure is between the first substrate and the third substrate in the bonded structure.

In one embodiment, the step (d) further comprises removing the first insulation layer.

In one embodiment, in step (e) the conducting structure is spaced apart from the first drain region.

In one embodiment, the conducting structure comprises metal, and in step (e) the conducting structure is in contact with the first source region.

In one embodiment, in step (e) the conducting structure comprises metal and is in contact with the first substrate.

In one embodiment, the conducting structure comprises metal, and the step (e) comprises forming the conducting structure on the first substrate.

In one embodiment, the step (e) further comprises patterning the first insulation layer and forming the conducting structure in the first insulation layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF PREFERRED EMBODIMENTS

Figure 1:
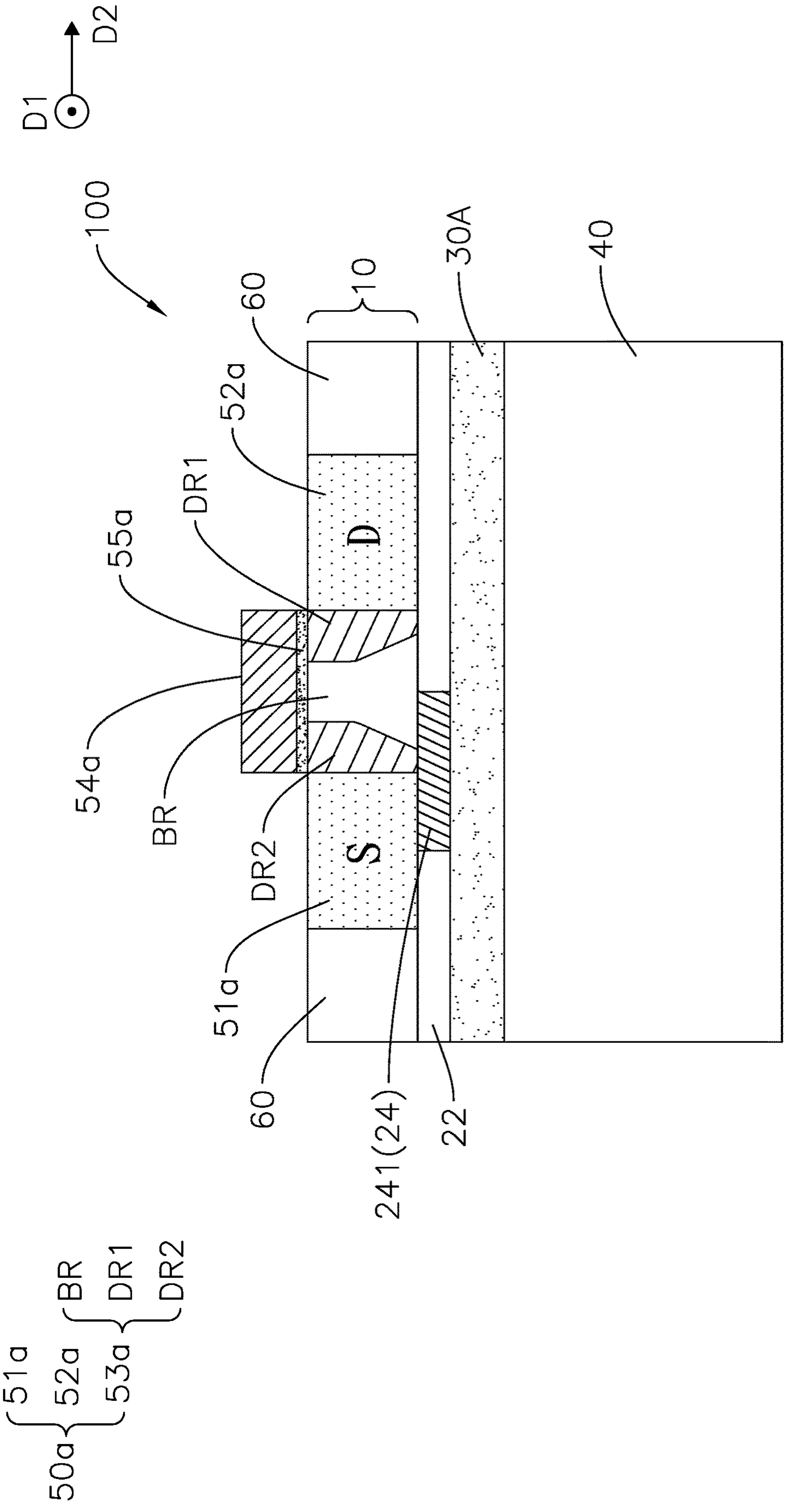
FIG. 1 is a schematic view to illustrate a semiconductor structure according to the present invention.

The terminology used in the description presented below is intended to be interpreted in its broadest reasonable manner, even though it is used in conjunction with a detailed description of certain specific embodiments of the technology. Certain terms may even be emphasized below; however, any terminology intended to be interpreted in any restricted manner will be specifically defined as such in this Detailed Description section.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic view to illustrate an embodiment of a semiconductor structure according to the present invention. As shown in FIG. 1, a semiconductor structure 100 comprises a first insulation layer 30A, a first semiconductor layer 10 over the first insulation layer 30A, and a conducting structure 24. The first semiconductor layer 10 may comprise a single crystalline semiconductor material. In the embodiment shown in FIG. 1, the semiconductor structure 100 further comprises a second semiconductor layer 40. The second semiconductor layer 40 may also comprise semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The first insulation layer 30A, such as an oxide or nitride, is disposed between the first semiconductor layer 10 and the second semiconductor layer 40. In an embodiment shown in FIG. 1, the first semiconductor layer 10, the second semiconductor layer 40, and the first insulation layer 30A may be collectively referred to as a silicon-on-insulator (SOI) substrate. In another embodiment, the first semiconductor layer 10, the second semiconductor layer 40, and the first insulation layer 30A may be included in a silicon-metal-on-insulator (SMOI) substrate, a silicon-etch-stopper-on-insulator (SEOI), or a silicon-metal-etch-stopper-on-insulator (SMEOI) substrate.

The first semiconductor layer 10 comprises a first transistor 50*a* (electronic component). As shown in FIG. 1, shallow trench isolation 60 laterally surrounds the first transistor 50*a* and other components (e.g., a second transistor or other components which may also exist in the first semiconductor layer 10). However, in some embodiments, the shallow trench isolation 60 may not disposed between the first transistor and an adjacent component. The shallow trench isolation 60 may comprises a dielectric material such as silicon oxide. The first transistor 50*a* comprises a first source region 51*a*, a first drain region 52*a*, and a first channel region 53*a*. The first source region 51*a* and the first drain region 52*a* are spaced apart from each other with the first channel region 53*a* located therebetween. The first source region 51*a* and the first drain region 52*a* may be doped with a first type of dopant. The first type of dopant may include n-type dopants such as P, As, and Sb, and in another embodiment, the first type of dopant may include p-type dopants such as B, Ga. In one embodiment, the doping concentration of the first source region 51*a* and the first drain region 52*a* may be from about $3.0\times10^{19}$ atoms/cm$^3$ to about $3.0\times10^{21}$ atoms/cm$^3$. The first source region 51*a* and the first drain region 52*a* extend through the thickness of the first semiconductor layer 10 and are in contact with the dielectric layer 22. The first channel region 53*a* may be doped with a second type of dopant, which is the opposite of the first conductivity type doping. In one embodiment, the doping concentration of the first channel region 53*a* may be from about $1.0\times10^{15}$ atoms/cm$^3$ to about $1.0\times10^{19}$ atoms/cm$^3$.

The semiconductor structure 100 further comprises a first gate (gate conductor) 54*a* disposed over the first semiconductor layer 10 and a first gate insulator 55*a* disposed between the first semiconductor layer 10 and the first gate 54*a*. The first gate insulator 55*a* may comprise a conventional dielectric material such as silicon oxide, silicon nitride, silicon oxynitride, and/or a stack thereof. Alternately, the first gate insulator 55*a* may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The first gate 54*a* may comprise a semiconductor gate layer and/or a metal gate layer. The metal gate layer may comprise conductive metal nitride, or an alloy thereof. The first gate 54*a* may comprise a stack of a metal gate layer and a semiconductor gate layer. In one embodiment, a width of the first gate 54*a* may be substantially equal to the critical dimension of the lithographic process performed. The first channel region 53*a* may be disposed under the first gate 54*a*, such that the first source region 51*a*, the first drain region 52*a*, the first channel region 53*a*, and the first gate 54*a* may function altogether as a MOSFET. FIG. 1 illustrates a planar FET, however, the MOSTEF can be a fin field-effect transistor (FinFET), a Gate-all-around FET, etc., in another embodiment. In one embodiment, the thickness of the first semiconductor layer 10 may be in a range between 5 nm and 200 nm, such that the first transistor 50*a* may be a partially depleted transistor with the first channel region 53*a* being partially depleted. However, these values are merely examples and are not intended to be limiting.

The conducting structure 24 is disposed under the first channel region 53*a* and over the first insulation layer 30A. The conducting structure 24 may comprise metal, for example, the conducting structure 24 may be made of copper. As shown in FIG. 1, the conducting structure 24 is in contact with and electrically connected to the first semiconductor layer 10 and is grounded or electrically connected to a power supply or a source region of the first transistor 50*a* or other device, such that the carriers accumulated in the first semiconductor layer 10, e.g., in the first channel region 53*a*, may be removed through the conducting structure 24, and the floating body effect may be reduced. The conducting structure 24 may be surrounded by dielectric layer 22. The dielectric layer 22 may be a single layer or may include multiple layers. The dielectric layer 22 may be made of materials including but not limited to silicon oxide ($SiO_x$), silicon nitride ($Si_xN_y$), silicon oxynitride (SiON), dielectric material(s) with low dielectric constant (low-k), or combinations thereof. In an embodiment shown in FIG. 1, the dielectric layer 22 is in contact with the first semiconductor layer 10 and the first insulation layer 30A, and the first semiconductor layer 10 is spaced apart from the first insulation layer 30A by the conducting structure 24 and the dielectric layer 22.

As shown in FIG. 1, the conducting structure 24 may comprise a conducting line portion 241, e.g., the conducting structure 24 may include a metal line. In an embodiment shown in FIG. 1, the conducting line portion 241 is in contact with the first semiconductor layer 10. But in another embodiment, the conducting structure 24 may further include a via portion in contact with the first semiconductor layer 10 (e.g., under the first channel region 53*a*) for electrical connection between the conducting line portion 241 and the first semiconductor layer 10.

The conducting structure 24 may be spaced apart from the first drain region 52*a*. In one embodiment, the first channel region 53*a* comprises a body region BR, a first depletion region DR1, and a second depletion region DR2. The first depletion region DR1 is a region extending from the first drain region 52*a*, and the second depletion region DR2 is a region extending from the first source region 51*a*. The first depletion region DR1 and the second depletion region DR2 are depletion regions from which almost all the free charge carriers are removed. The body region BR refers to rest of the first channel region 53*a* aside from the first depletion region DR1 and the second depletion region DR2. In other words, the first depletion region DR1 is located between the body region BR and the first drain region 52*a*, and the second depletion region DR2 is located between the body region BR and the first source region 51*a*. FIG. 1 shows the first depletion region DR1 and the second depletion region DR2 of the first transistor 50*a* at zero bias between the first source region 51*a* and the first drain region 52*a*, however, the first depletion region DR1 and the second depletion region DR2 may be widened or narrowed due to bias applied to the first transistor 50*a*. Also, regions possessed by the first depletion region DR1 and the second depletion region DR2 may vary with the doping concentrations of the first source region 51*a* and the first drain region 52*a*. As shown in FIG. 1, the conducting structure 24 may be spaced apart from the first depletion region DR1 at zero bias between the first source region 51*a* and the first drain region 52*a*.

In an embodiment shown in FIG. 1, the conducting line portion 241 is in contact with the first source region 51*a*. In other words, the conducting structure 24 is in contact with the first source region 51*a*. As shown in FIG. 1, the first gate 54*a* may extend in a first direction D1, and the first source region 51*a*, the first channel region 53*a*, and the first drain region 52*a* may be sequentially arranged in a second direction D2 perpendicular to the first direction D1. The conducting line portion 241 may extend in the first direction D1. In one embodiment, the conducting line portion 241 may be a conducting fragment in contact with the first source region 51 of the first transistor 50*a*. In one embodiment, the conducting line portion 241 may be a conducting line extending through and in contact with a plurality of transistors, e.g., the first transistor 50*a* and an adjacent transistor arranged alongside the first transistor 50*a* in the first direction D1.

FIGS. 2A to 2G are schematic views to illustrate intermediate stages in the manufacture of a semiconductor structure similar to the semiconductor structure as shown in FIG. 1.

Figure 2A:
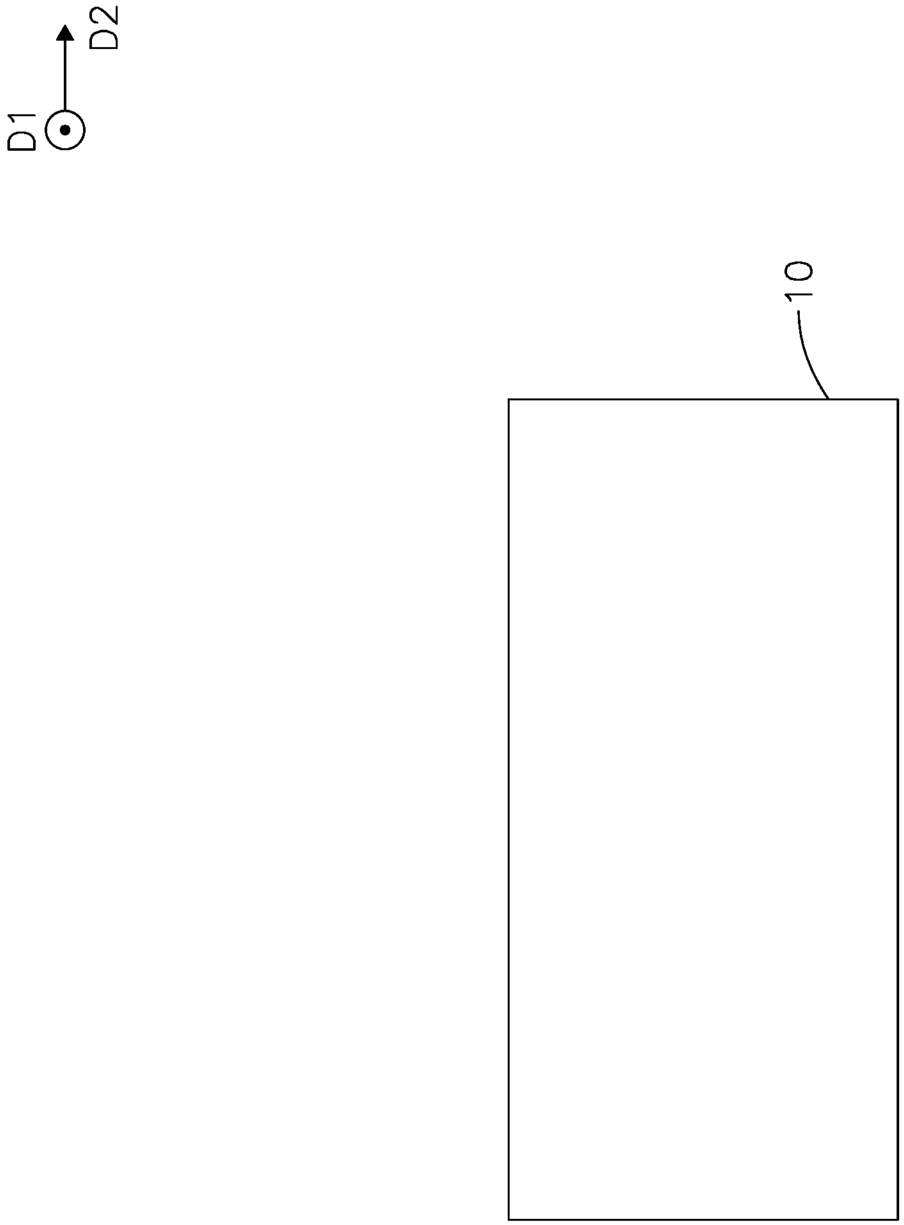
FIGS. 2A to 2G are schematic views to illustrate intermediate stages in the manufacture of a semiconductor structure similar to the semiconductor structure as shown in FIG. 1 according to the present invention.

As shown in FIG. 2A, a first substrate 10 is provided. In one embodiment, the first substrate 10 is a wafer with diameter of 6, 8, 12, or 18 inches. In this situation, the first substrate may be referred to as a device wafer. The first substrate 10 is a single crystalline substrate, for example, made of semiconductor materials including but not limited to silicon, germanium, gallium arsenide (GaAs), indium phosphide (InP), silicon carbon (SiC), and gallium nitride (GaN).

Figure 2B:
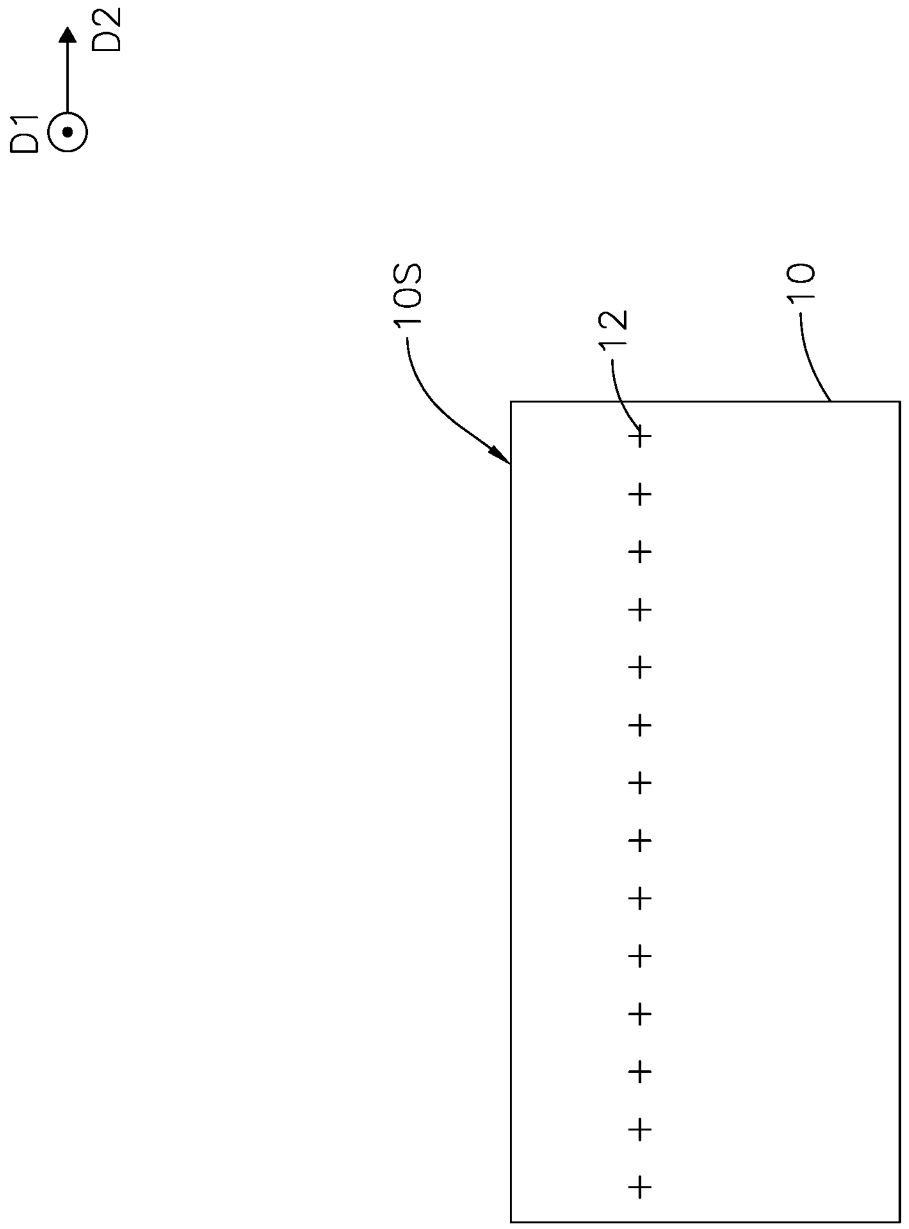

As shown in FIG. 2B, a hydrogen layer 12 is implanted into the first substrate 10. The hydrogen layer 12 is implanted inside the first substrate 10 at a certain depth before bonding. The implantation may be conducted before the formation of the conducting structure 24. In one embodiment, hydrogen ions are implanted into the first substrate 10 using a dosage of $10^{16}$ to $2\times10^{17}$ ions/cm 2 at an implantation energy of 50 to 150 KeV. A larger dosage can be used with larger substrates. The hydrogen layer 12 may be formed at a depth of about $4\times10^{-5}$ to $8\times10^{-5}$ inch (1 to 2 μm) from a top surface 10S of the first substrate 10.

Figure 2C:
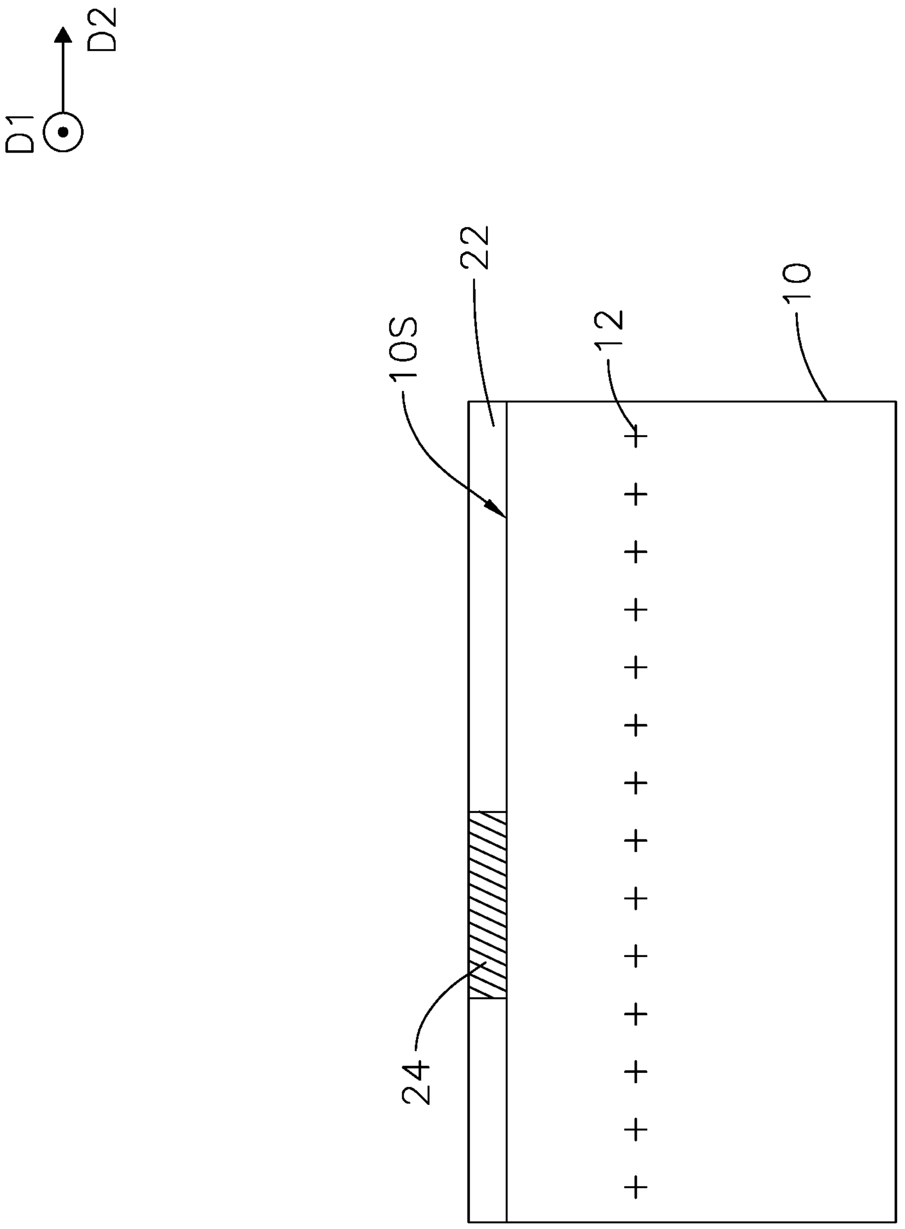

As shown in FIG. 2C, a conducting structure 24 is formed on the first substrate 10. In an embodiment shown in FIG. 2C, a dielectric layer 22 is formed on the top surface 10S of the first substrate 10, and the conducting structure 24 is formed in the dielectric layer 22. The dielectric layer 22 may be made of the materials described above with regard to FIG. 1, the like, or combinations thereof, by any suitable method known in the art, such as spinning, chemical vapor deposition (CVD), and plasma enhanced CVD (PECVD). The conducting structure 24 comprises metal. The conducting structure 24 may be formed using suitable conductive materials such as copper, aluminum, aluminum alloys, copper alloys or the like and may be made through any suitable formation process (e.g., lithography with etching, damascene, dual damascene, or the like). As shown in FIG. 2C, the conducting structure 24 is in contact with the first substrate 10, e.g., at the top surface 10S of the first substrate 10.

Figure 2D:
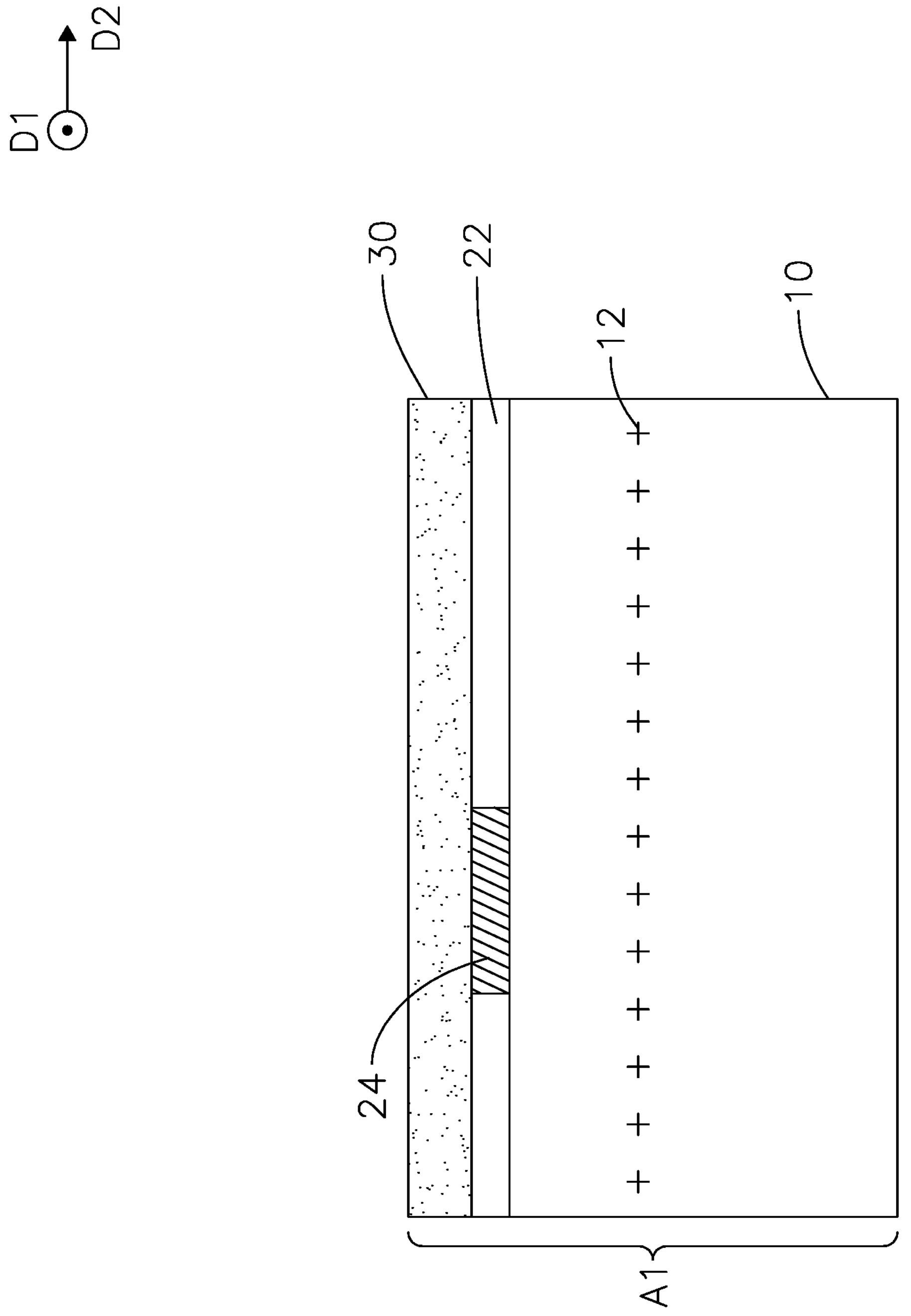

As shown in FIG. 2D, a first insulation layer 30 is formed on the conducting structure 24 and the dielectric layer 22, such that the conducting structure 24 is disposed between the first insulation layer 30 and the first substrate 10. The first insulation layer 30 may comprise at least one dielectric sublayer, such as an oxide layer, and may be formed by deposition such as CVD or PVD. The first insulation layer 30 may be formed on the conducting structure 24 before bonding. As such, a first structure A1 is provided. The first structure A1 comprises a first substrate 10, a first insulation layer 30 on the first substrate 10, and a conducting structure 24 in contact with the first substrate 10.

Figure 2E:
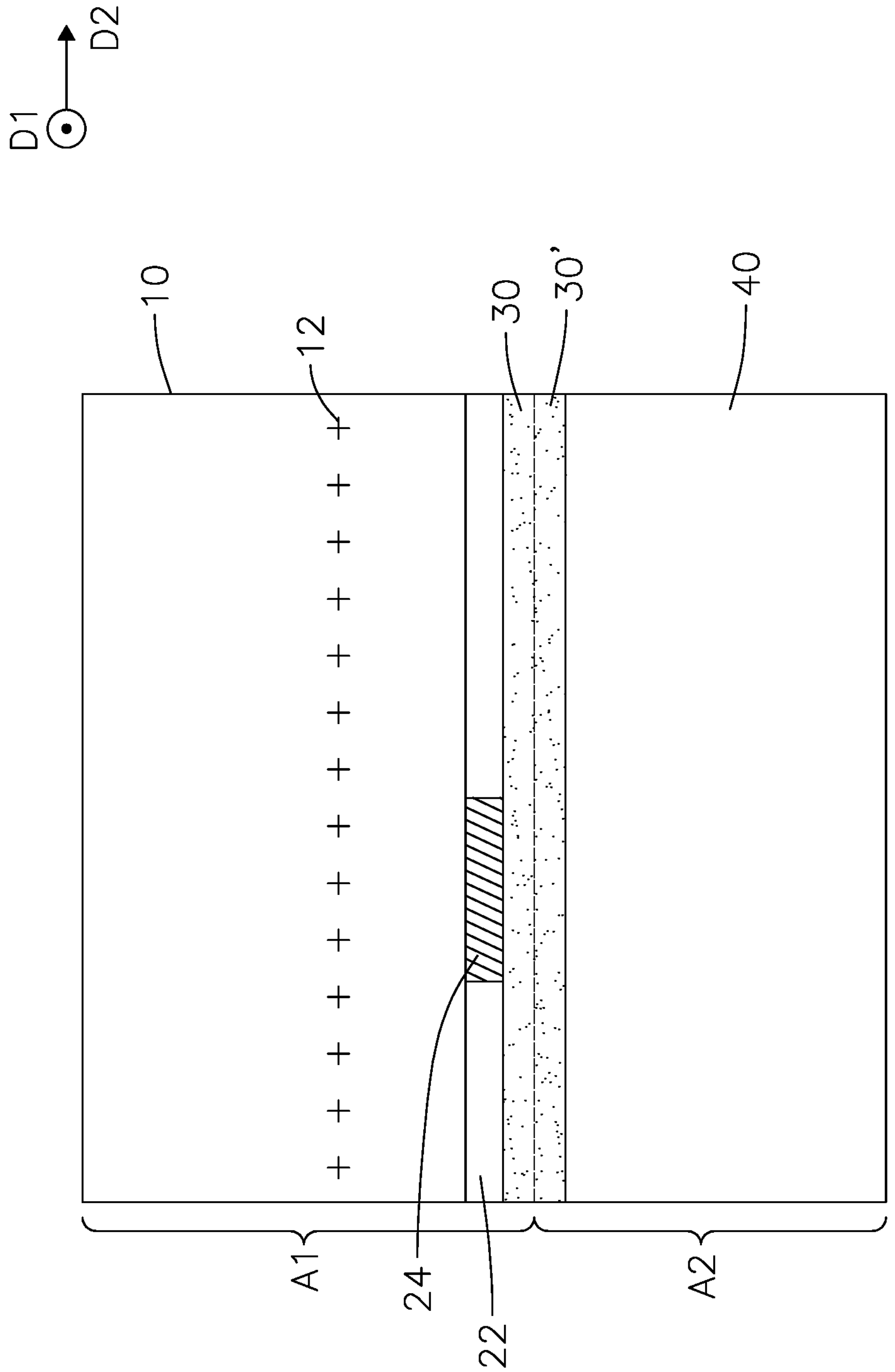

As shown in FIG. 2E, a second structure A2 is provided. The second structure A2 comprises a second substrate 40. In one embodiment, the second substrate 40 is a wafer with diameter of 6, 8, 12, or 18 inches and may be referred to as a handle wafer. The second substrate may be a single crystalline semiconductor substrate, for example, made of silicon, germanium, gallium arsenide (GaAs), or indium phosphide (InP), or a glass substrate. In one embodiment, the second substrate 40 contains multiple electronic devices including but not limited to at least one of transistors, diodes, capacitors, and resistors. Then, the first structure A1 is flipped and bonded onto the second structure A2 by the first insulation layer 30 to form a bonded structure, as shown in FIG. 2E.

In one embodiment, a second insulation layer 30' may be formed on the second substrate before bonding. The cleaned portion of the first insulation layer 30 of first structure A1 is bonded with the cleaned portion of the second insulation layer 30' of the second structure A2 to form the first insulation layer 30A. Conventional cleaning techniques such as the RCA wafer cleaning procedure may be used. The second insulation layer 30' may comprise at least one dielectric sublayer, such as an oxide layer, and may be formed by thermal oxidation or deposition such as CVD or PVD. One method of bonding between the first structure A1 and the second structure A2 is hydrophilic bonding, in which a hydroxyl group (OH—) is formed on the surface to be bonded due to the presence of an electric charge of atoms.

Figure 2F:
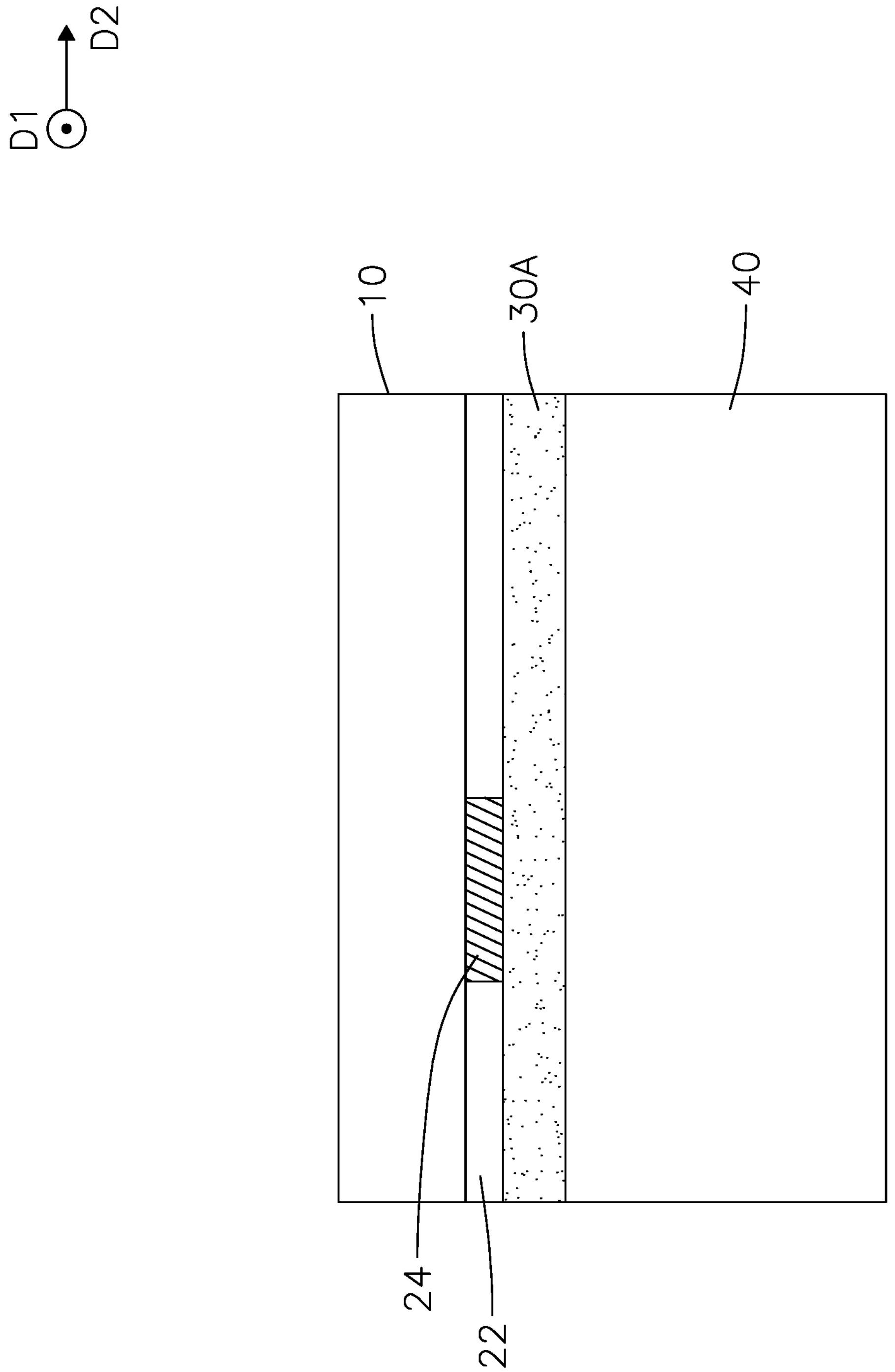

As shown in FIG. 2F, a portion of the first substrate 10 is removed from the bonded structure from approximately the depth of the implanted hydrogen layer 12 as shown in FIG. 2E. The portion of the first substrate 10 may be removed by (1) heating the bonded structure at a first temperature, (2) cleaving the bonded structure by a mechanical pressure, or (3) quenching the bonded structure with liquid nitrogen. A first temperature is usually below 400 Celsius degrees to avoid any damages to the electronic devices fabricated on the second substrate 40 if there are any. The portion of the first substrate 10 remained on the bonded structure may be less than 3 μm depending on the semiconductor manufacturing technology nodes applied for fabrication of various electronic devices.

After removal, the separated surface of the first substrate 10 usually has a roughness on the order of a few hundred angstroms. Such separated surface of the bonded structure, i.e., the top surface of the first substrate 10 may be polished by chemical mechanical polishing (CMP) to planarize and minimize non-uniformity of the first substrate 10. Other approaches such as etching may be used for the same purpose. An etch stop layer may need to be deposited in advance when etching is used to planarize and minimize non-uniformity of the separated surface of the first substrate 10.

Figure 2G:
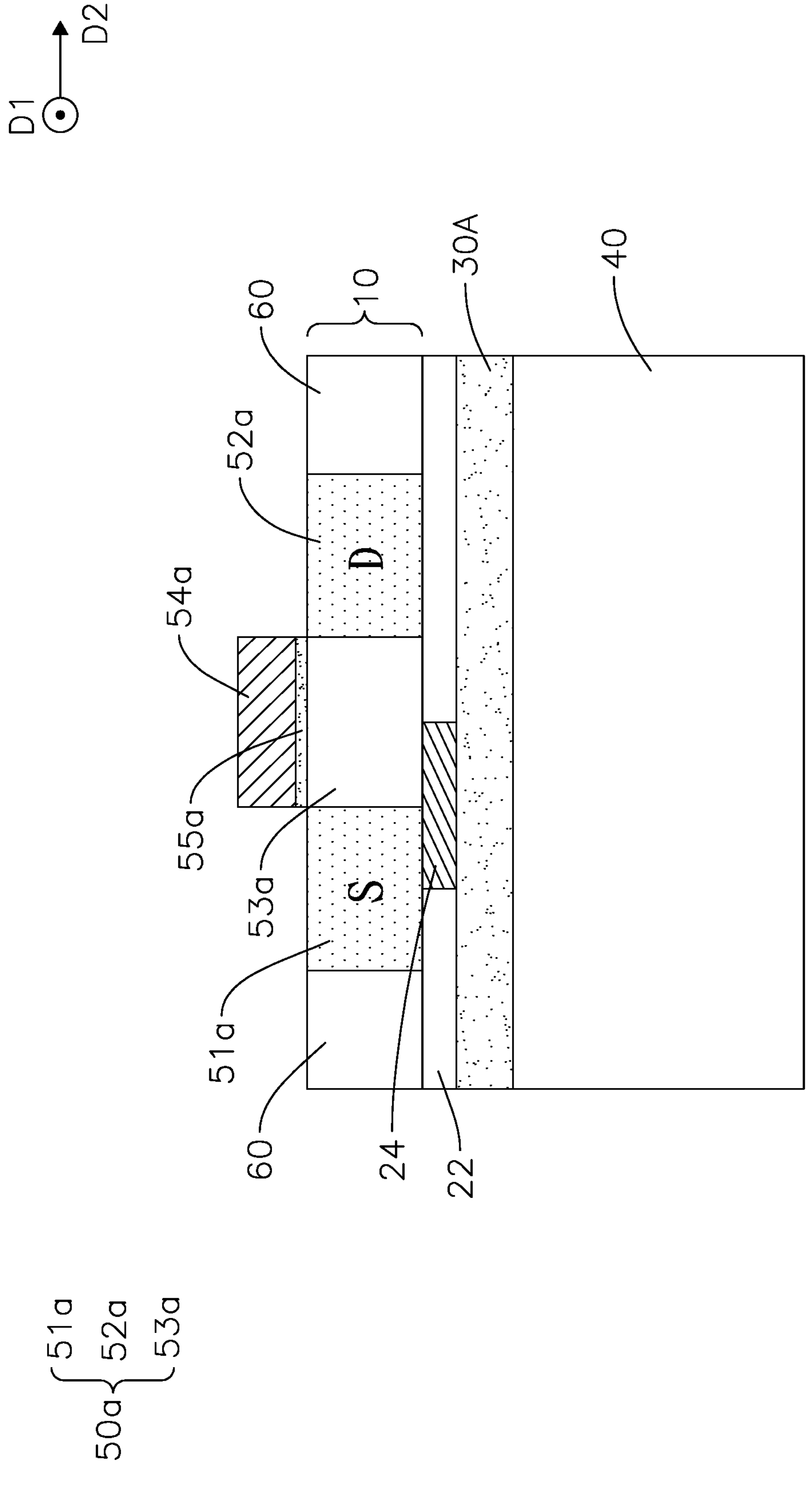

Then, an electronic component, for example, a first transistor 50*a*, may be formed in the first substrate 10, as shown in FIG. 2G. The first transistor 50*a* may be formed. Specifically, a first source region 51*a*, a first drain region 52*a*, a first channel region 53*a*, a first gate 54*a* over the first channel region 53*a*, and a first gate insulator 55*a* between the first gate 54*a* and the first channel region 53*a* may be formed by conventional methods known in the art. As such, the semiconductor structure similar to semiconductor structure 100 shown in FIG. 1 may be formed. In such embodiment, an ion implantation may be performed to form the first source region 51*a* and the first drain region 52*a* extending through the thickness of the first substrate 10. In such embodiment, the first transistor 50*a* is formed in a position such that the conducting structure 24 is spaced apart from the first drain region 52*a* of the first transistor 50*a*. In one embodiment, the first transistor 50*a* is formed in a position such that the conducting structure 24 is in contact with the first source region 51*a*. Metal contacts may further be formed on the first source region 51*a*, the first drain region 52*a*, and/or the first gate 54*a*.

FIGS. 3A to 3G are schematic views to illustrate intermediate stages in the manufacture of a semiconductor structure similar to the semiconductor structure shown in FIG. 1.

Figure 3A:
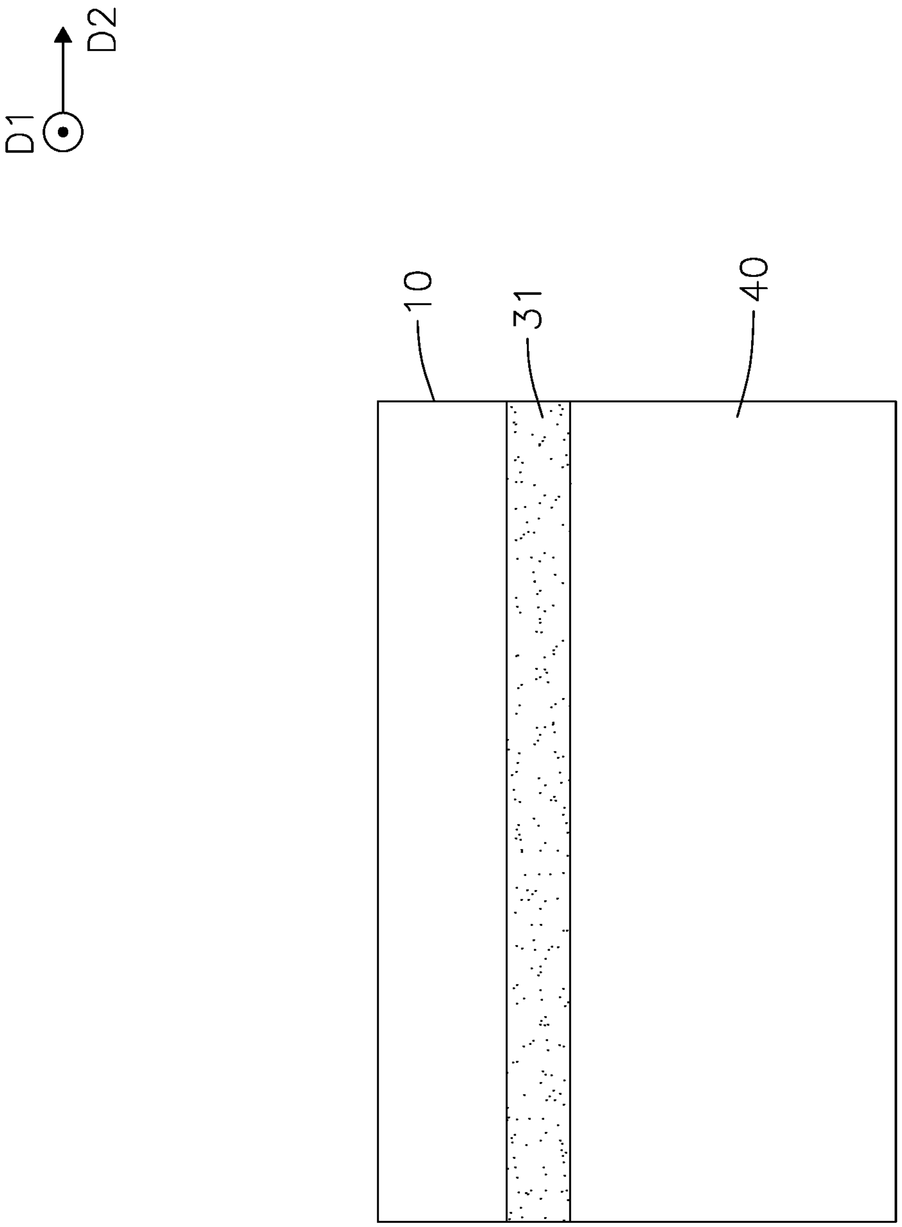
FIGS. 3A to 3G are schematic views to illustrate intermediate stages in the manufacture of a semiconductor structure similar to the semiconductor structure shown in FIG. 1 according to the present invention.

As shown in FIG. 3A, a first substrate 10, a second substrate 40, and a first insulation layer 31 between the first substrate 10 and the second substrate 40 are provided. The structure shown in FIG. 3A may be a silicon-on-insulator (SOI) substrate, a silicon-metal-on-insulator (SMOI) substrate, a silicon-etch-stopper-on-insulator (SEOI), or a silicon-metal-etch-stopper-on-insulator (SMEOI) substrate.

Figure 3B:
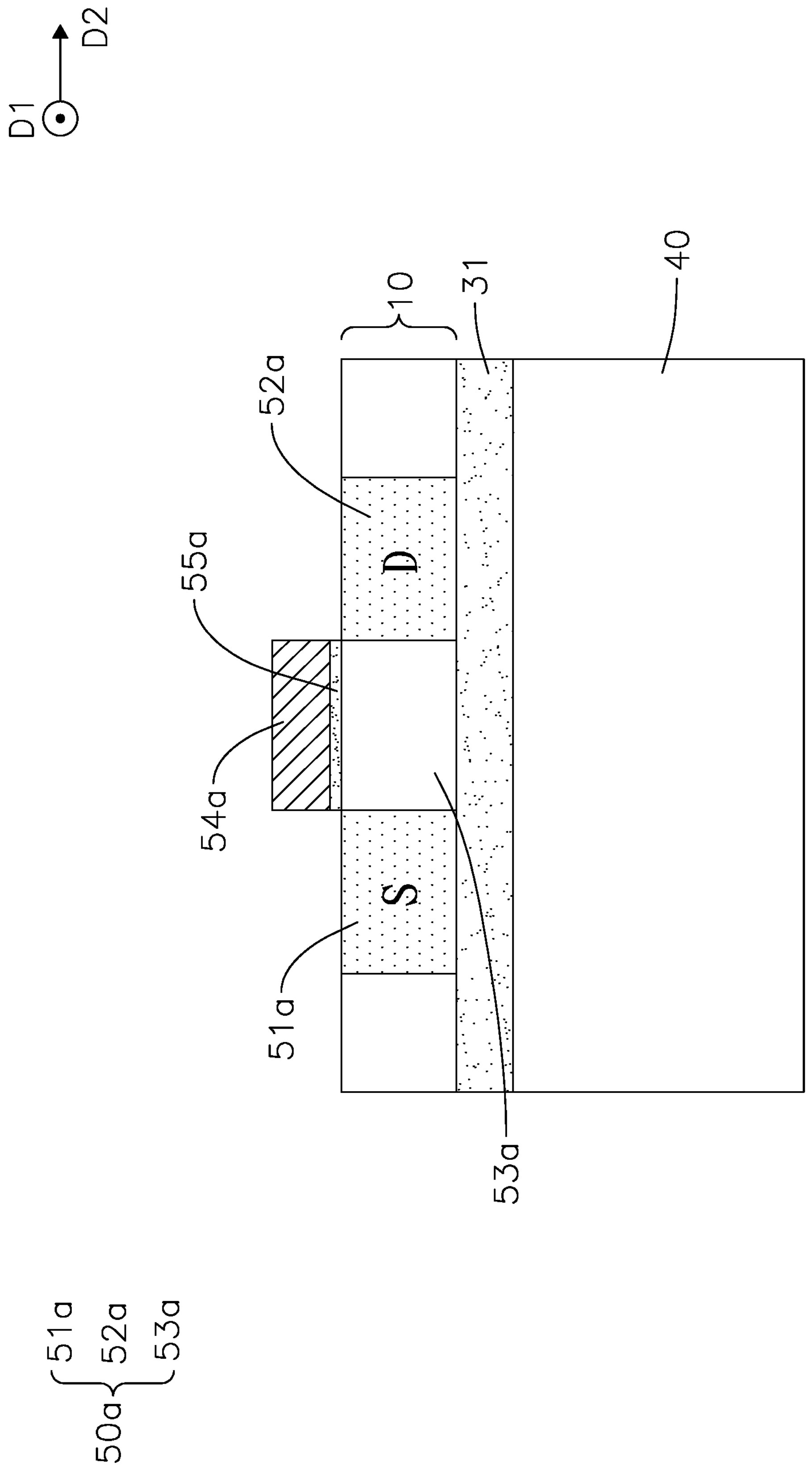

As shown in FIG. 3B, a first transistor 50*a* comprising a first source region 51*a*, a first drain region 52*a*, and a first channel region 53*a* is formed in the first substrate 10. Specifically, a first source region 51*a*, a first drain region 52*a*, a first channel region 53*a*, a first gate 54*a* over the first channel region 53*a*, and a first gate insulator 55*a* between the first gate 54*a* and the first channel region 53*a* may be formed by conventional methods known in the art. An ion implantation may be performed to form the first source region 51*a* and the first drain region 52*a* extending through the thickness of the first substrate 10.

Figure 3C:
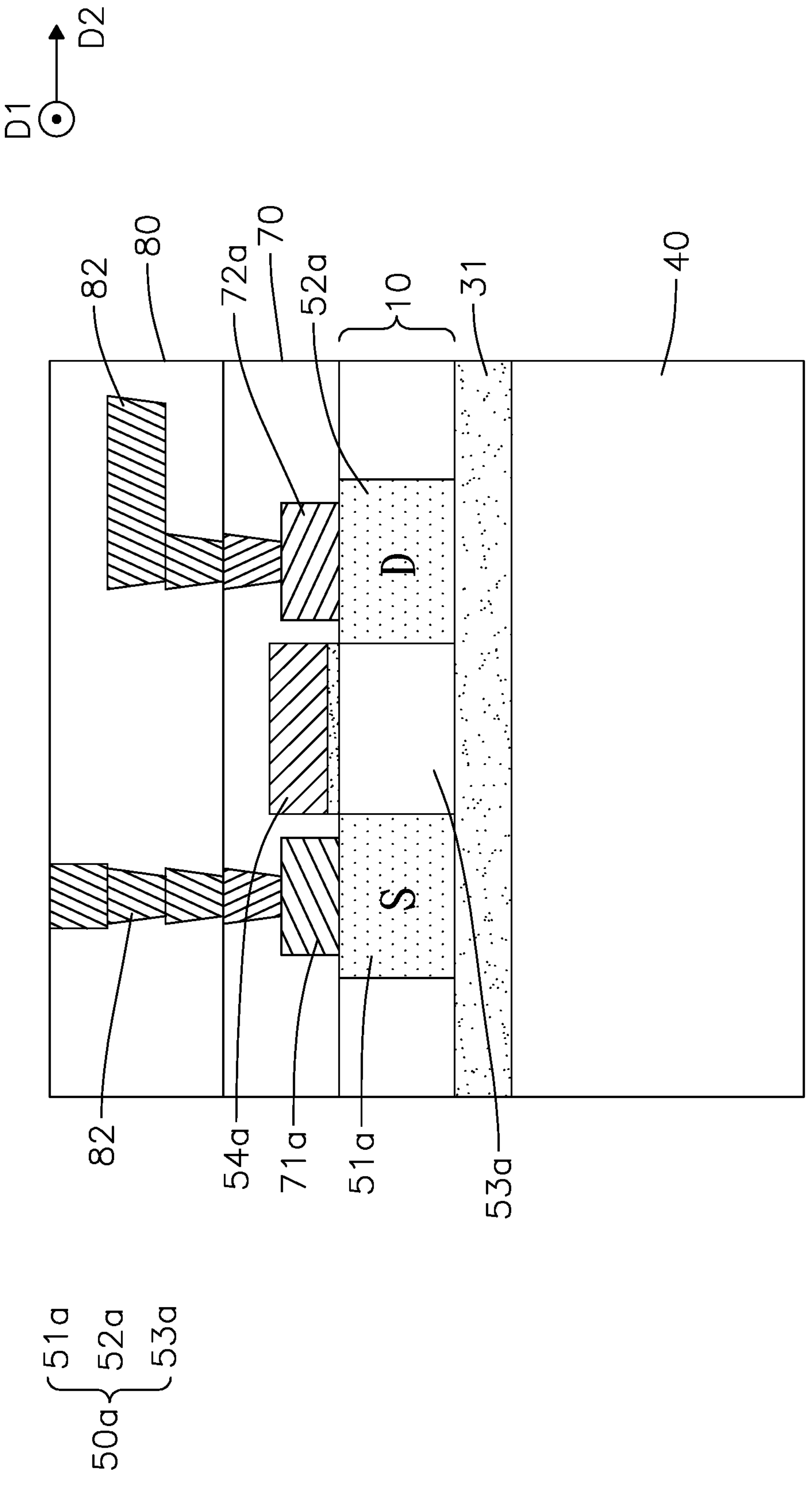

As shown in FIG. 3C, interlayer dielectric layers (ILDs) 70 are formed. ILDs 70 may include multilayers made of multiple dielectric materials, such as silicon oxide, silicon nitride, silicon oxynitride, and/or other applicable low-k dielectric materials. ILDs 70 may be formed by chemical vapor deposition (CVD), physical vapor deposition, (PVD), atomic layer deposition (ALD), spin-on coating, or other applicable processes. Contacts 71*a* and 72*a* are formed in openings through the ILDs 70, for example, by using acceptable photolithography and etching techniques. The contact 71*a* is physically and electrically coupled to the first source region 51*a*, and the contact 72*a* is physically and electrically coupled to the first drain region 52*a*. Contact that physically and electrically coupled to the first gate 54*a* may also be formed. Then, inter-metal dielectric (IMD) 80 is deposited over ILDs 70, and interconnect structures 82 are formed in the IMD 80 over the first substrate 10. The interconnect structures 82 are electrically coupled to contact 71*a* and/or contact 72*a*. As such, a first structure A1 is provided. The first structure A1 comprises a first substrate 10, a second substrate 40, and a first insulation layer 31 between the first substrate 10 and the second substrate 40, and the first substrate 10 may contain a first transistor 50*a* before bonding.

Figure 3D:
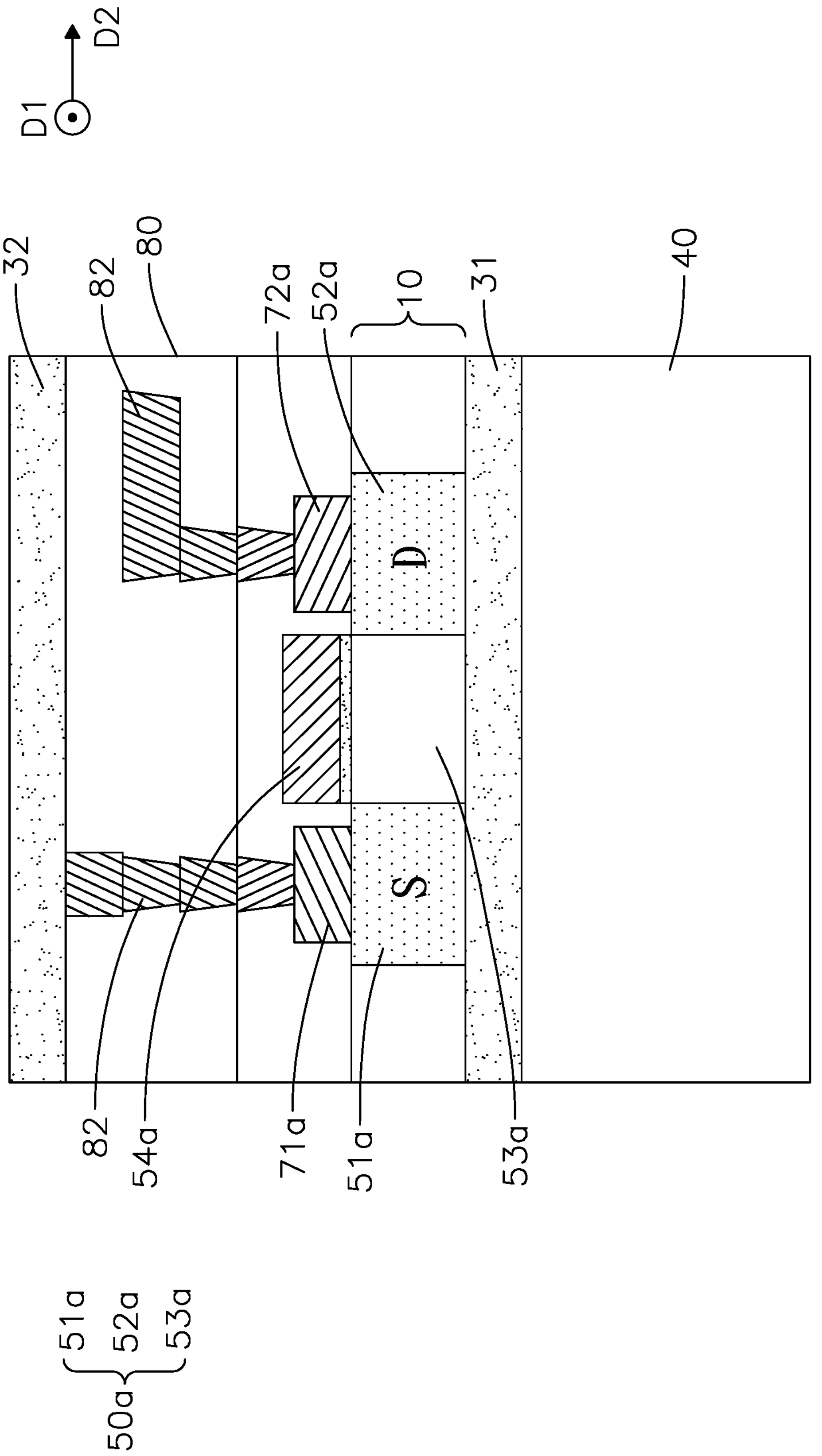

As shown in FIG. 3D, a bonding layer 32 is formed on the first structure A1 over the IMD 80 and the interconnect structures 82. The bonding layer 32 comprises at least one dielectric sublayer. The dielectric sublayer may comprise silicon dioxide or high-k (dielectric constant) materials, including but not limited to hafnium silicate, zirconium silicate, hafnium dioxide and zirconium dioxide. In one embodiment, the bonding layer 32 may be an oxide layer and may be formed by thermal oxidation or deposition such as CVD or PVD.

Figure 3E:
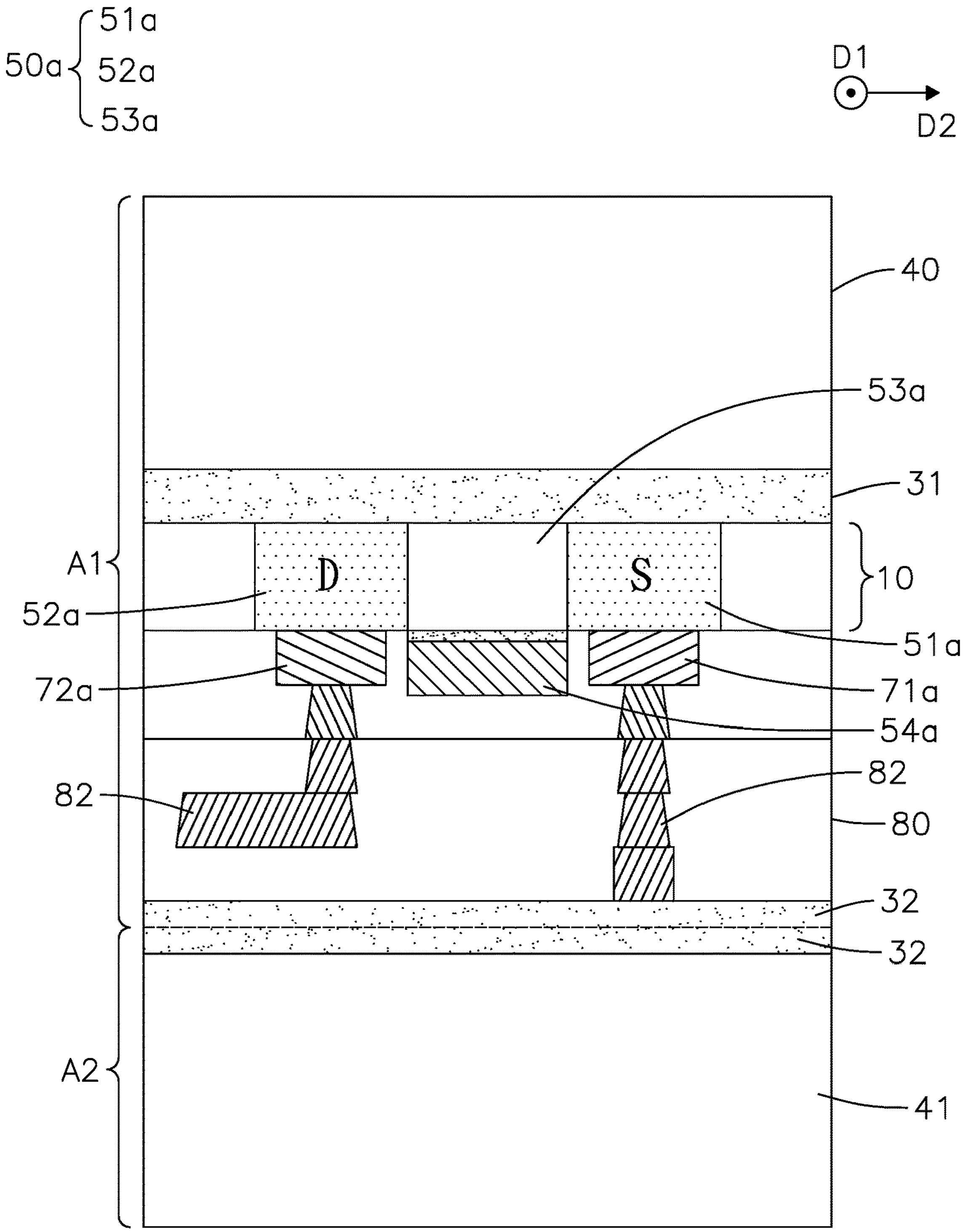

As shown in FIG. 3E, a second structure A2 is provided (step (b)). The second structure A2 comprises a third substrate 41. The third substrate 41 may be similar to the second substrate described above with regard to FIG. 2E. In an embodiment shown in FIG. 3E, a bonding layer 32 may also be formed on the third substrate 41 before bonding. Then, the first structure A1 is flipped and bonded onto the second structure A2 by the bonding layer 32 to form a bonded structure (step (c)). The first structure A1 may be bonded onto the second structure A2 in similar method as described above in FIG. 2E and corresponding paragraphs. As shown in FIG. 3E, the interconnect structures 82 are between the first substrate 10 and the third substrate 41 in the bonded structure.

Figure 3F:
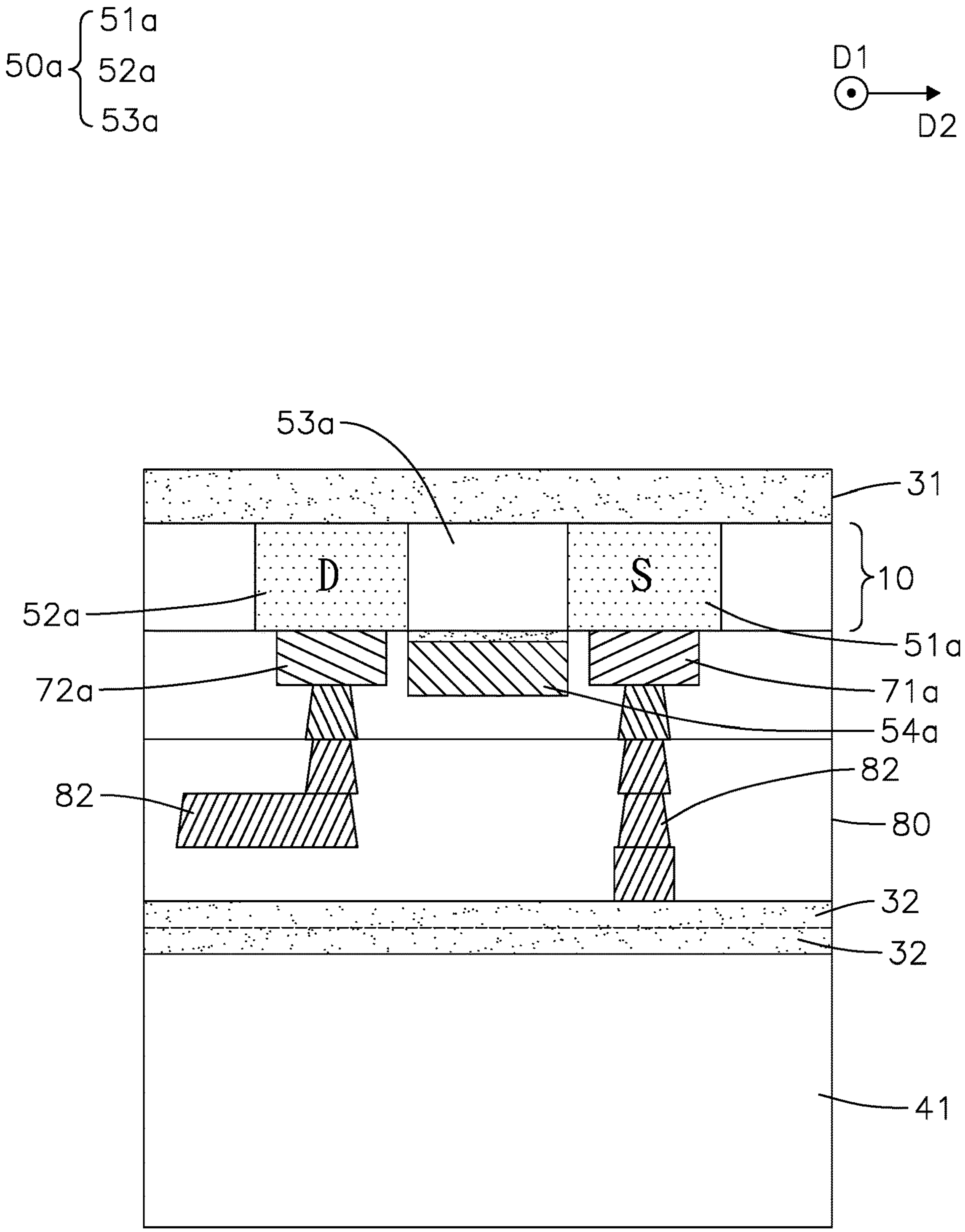

As shown in FIG. 3F, the second substrate 40 is removed from the bonded structure (step (d)). In one embodiment, a chemical mechanical polishing (CMP) operation is performed to remove the second substrate 40. Other approaches such as etching may be used for the same purpose. In such embodiment, the first insulation layer 31 may act as an etch stop layer, or an etch stop layer may need to be deposited in advance. The second substrate 40 may be completely removed from the bonded structure after step (d).

Figure 3G:
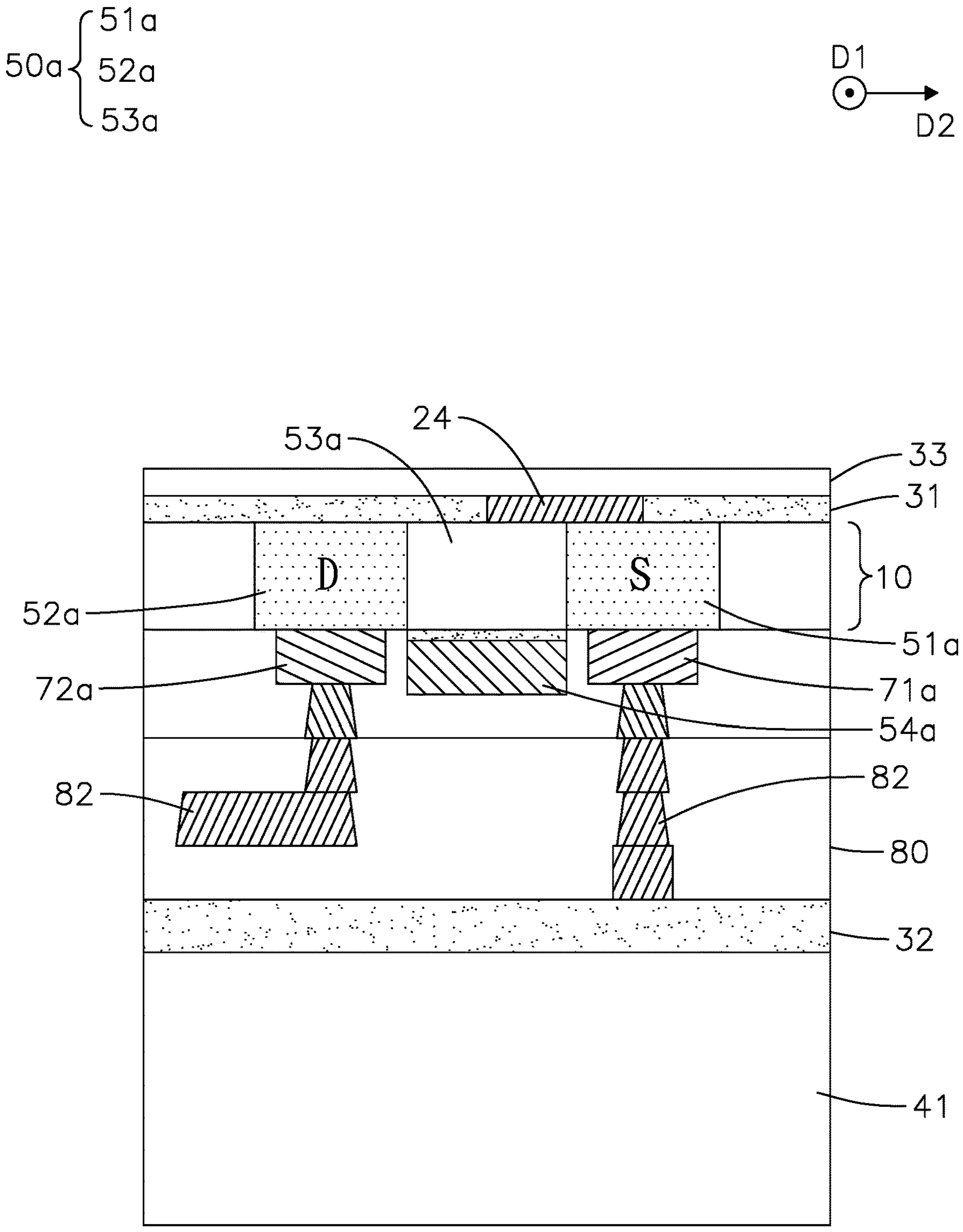

As shown in FIG. 3G, a conducting structure 24 is formed on and in contact with the first substrate 10 (step (e)). The conducting structure 24 may comprise metal. In an embodiment shown in FIG. 3G, the first insulation layer 31 may be patterned to form trenches and/or openings exposing at least a portion of the first substrate 10. The patterning process may involve photolithography with masking technologies and anisotropic etch operations (e.g. plasma etching or reactive ion etching). Then, the trenches and/or openings may be filled with conductive materials, and the conductive materials outside of the trenches and/or openings may be removed by a grinding process such as chemical mechanical polishing (CMP) or any suitable removal process. As such, the conducting structure 24 is formed in the first insulation layer 31 and in contact with the first substrate 10. In one embodiment, the conducting structure 24 is formed in a position such that the conducting structure 24 is spaced apart from the first drain region 52*a*. In one embodiment, the conducting structure 24 is in contact with the first source region 51*a*. Then, a second insulation layer 33 may further be formed on the conducting structure 24 and the first insulation layer 31. The second insulation layer 33 may be a protection layer and may be formed of any suitable material known in the art.

Figure 3H:
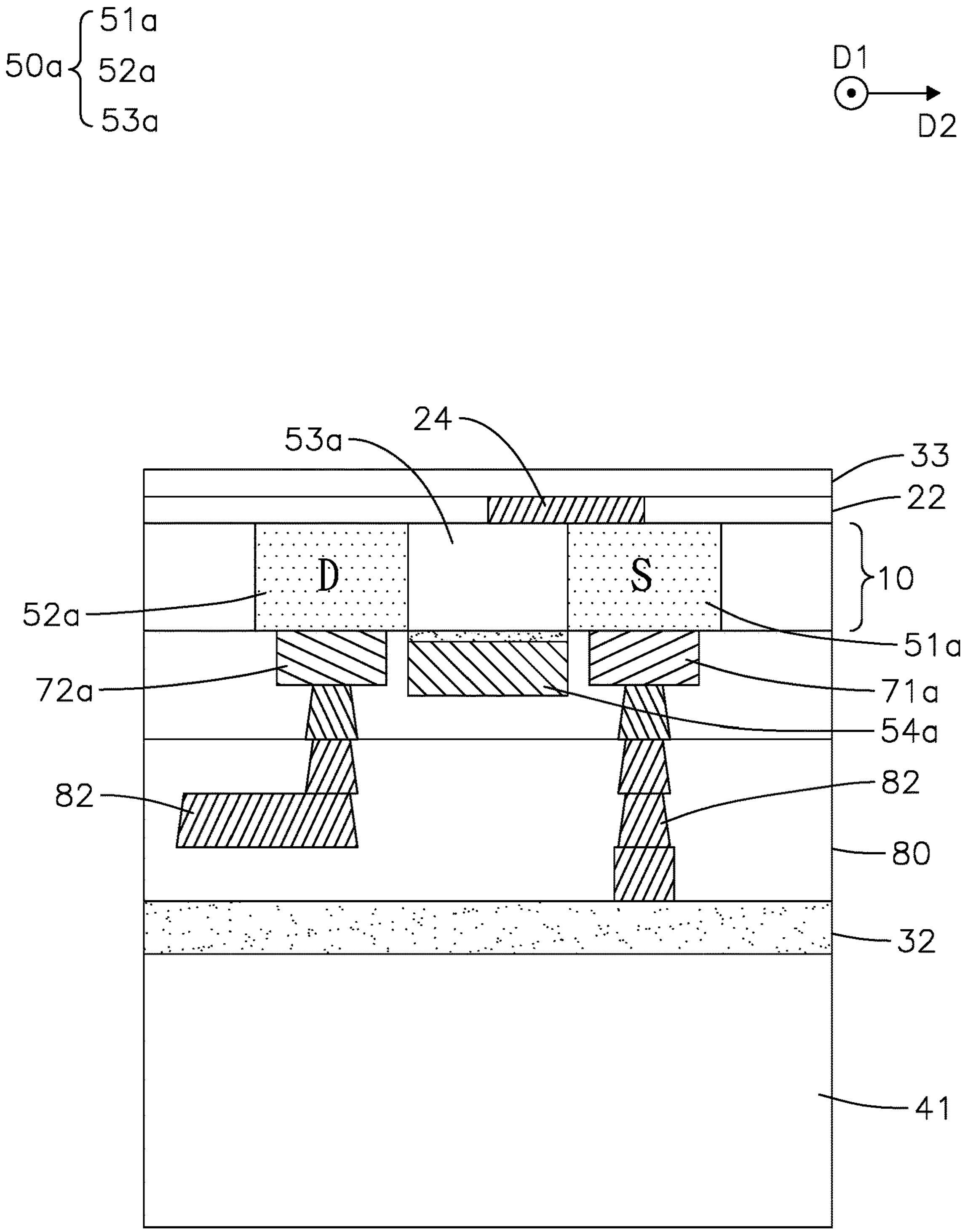
FIG. 3H is a schematic view to illustrate an intermediate stage in the manufacture of a semiconductor structure similar to the semiconductor structure shown in FIG. 1 according to the present invention.

In another embodiment as shown in FIG. 3H, the first insulation layer 31 is also removed in step (d) through suitable grinding process such as CMP operation or suitable etching process, such that the first substrate 10 is exposed after the step (d). Then, a dielectric layer 22 may be formed on the first substrate 10, and a conducting structure 24 may be formed in the dielectric layer 22. The materials and processes for forming the dielectric layer 22 and the conducting structure 24 may be similar to that of shown in FIG. 2C, and additional description is omitted herein for brevity. Then, a second insulation layer 33 similar to the second insulation layer 33 shown in FIG. 3G may be formed on the conducting structure 24 and the dielectric layer 22.

Figure 4:
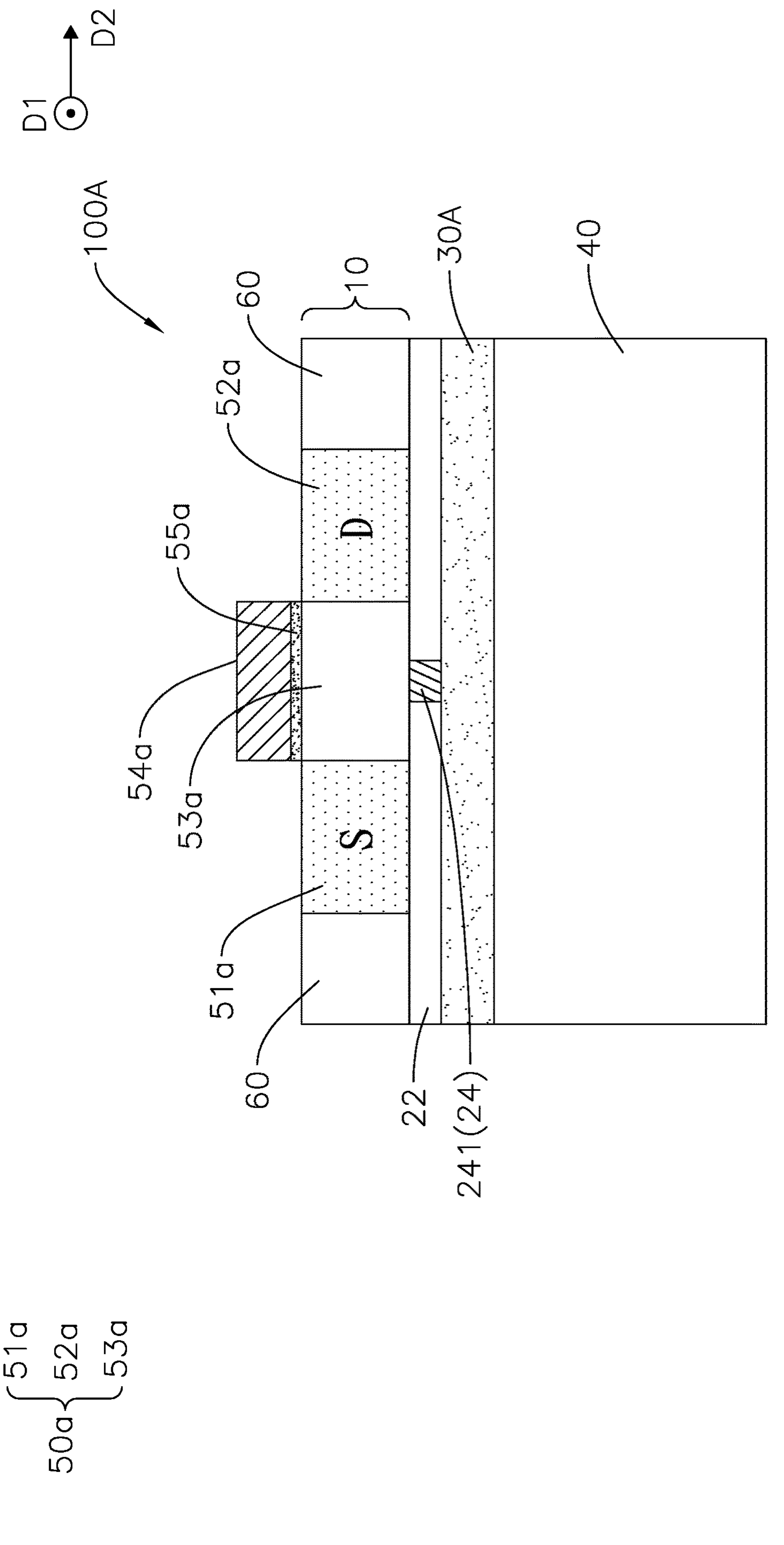
FIG. 4 is a schematic view to illustrate a semiconductor structure according to the present invention.

FIG. 4 is a schematic view to illustrate a semiconductor structure according to the present invention. Semiconductor structure 100A in FIG. 4 may be substantially similar to semiconductor structure 100 in FIG. 1 where like reference numerals indicate like elements. As shown in FIG. 4, a conducting line portion 241 of the conducting structure 24 is spaced apart from the first source region 51*a*. In one embodiment, a width of the conducting line portion 241 may be smaller than a width of the first gate 54*a*. The various intermediary stages of forming semiconductor structure 100A in FIG. 4 may be substantially similar to the process described above with respect to FIGS. 2A to 2G and FIGS. 3A to 3H, and additional description is omitted herein for brevity.

Figure 5:
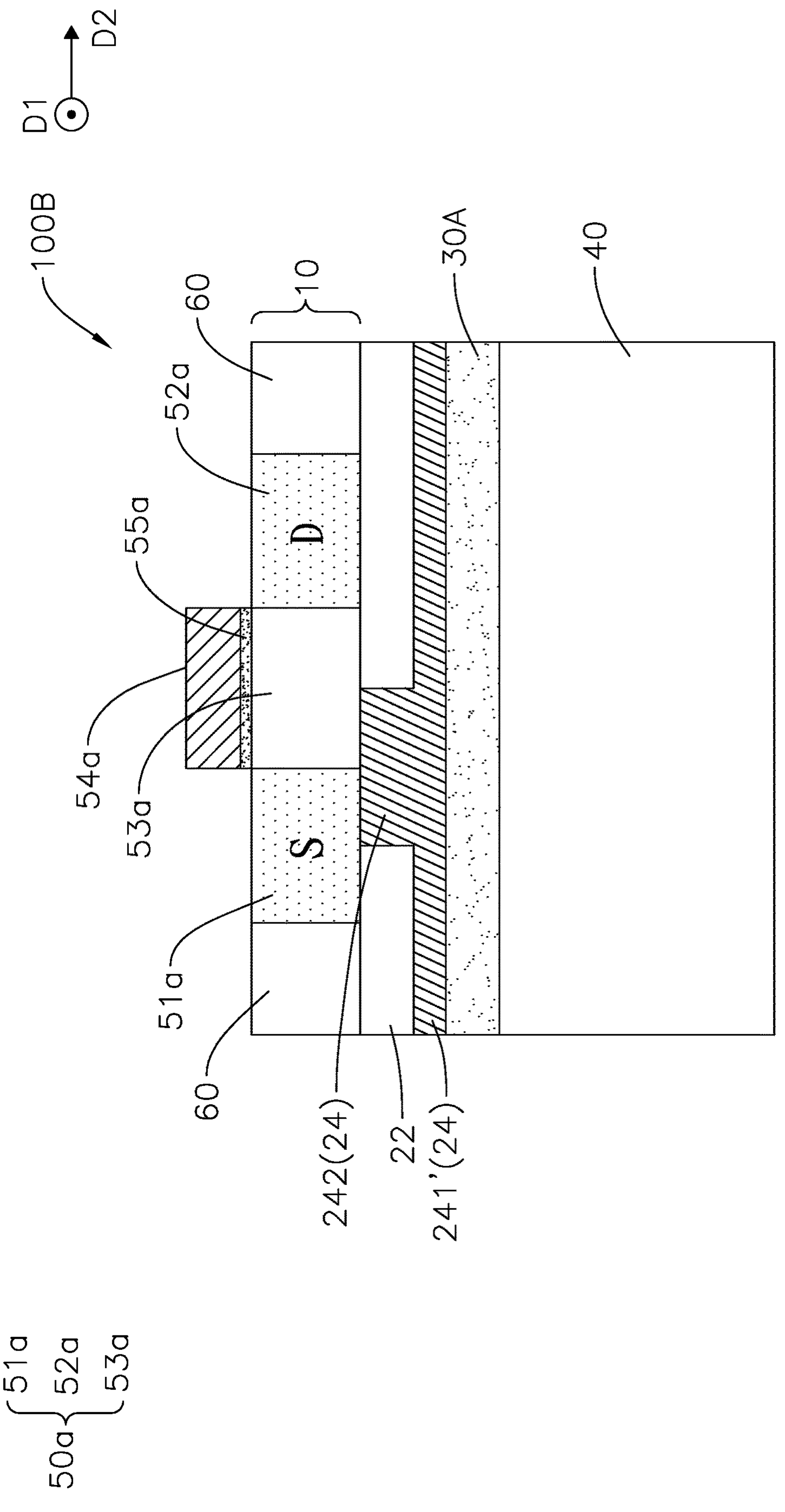
FIG. 5 is a schematic view to illustrate a semiconductor structure according to the present invention.

FIG. 5 is a schematic view to illustrate a semiconductor structure according to the present invention. Semiconductor structure 100B in FIG. 5 may be substantially similar to semiconductor structure 100 in FIG. 1 where like reference numerals indicate like elements. As shown in FIG. 5, the conducting structure 24 has a via portion 242 to be in contact with the first channel region 53*a* of the first semiconductor layer 10. Specifically, The via portion 242 may be positioned under the first channel region 53*a* and electrically connected to the conducting line portion 241'. As such, the conducting structure 24 is electrically connected to the first semiconductor layer 10 to remove the charge accumulated in the first semiconductor layer 10, e.g., in the first channel region 53*a*. The via portion 242 may be spaced apart from the first drain region 52*a*. However, as shown in FIG. 5, the via portion 242 may be in contact with the first source region 51*a*. In the embodiment shown in FIG. 5, the first gate extends in a first direction D1, and the conducting line portion 241' of the conducting structure 24 may extend in the second direction D2 perpendicular to the first direction D1. The conducting structure 24 may be surrounded by the dielectric layer 22, and the first semiconductor layer 10 is spaced apart from the first insulation layer 30A by the conducting structure 24 and the dielectric layer 22. The various intermediary stages of forming semiconductor structure 100B in FIG. 5 may be substantially similar to the process described above with respect to FIGS. 2A to 2G and FIGS. 3A to 3H, and additional description is omitted herein for brevity.

Figure 6:
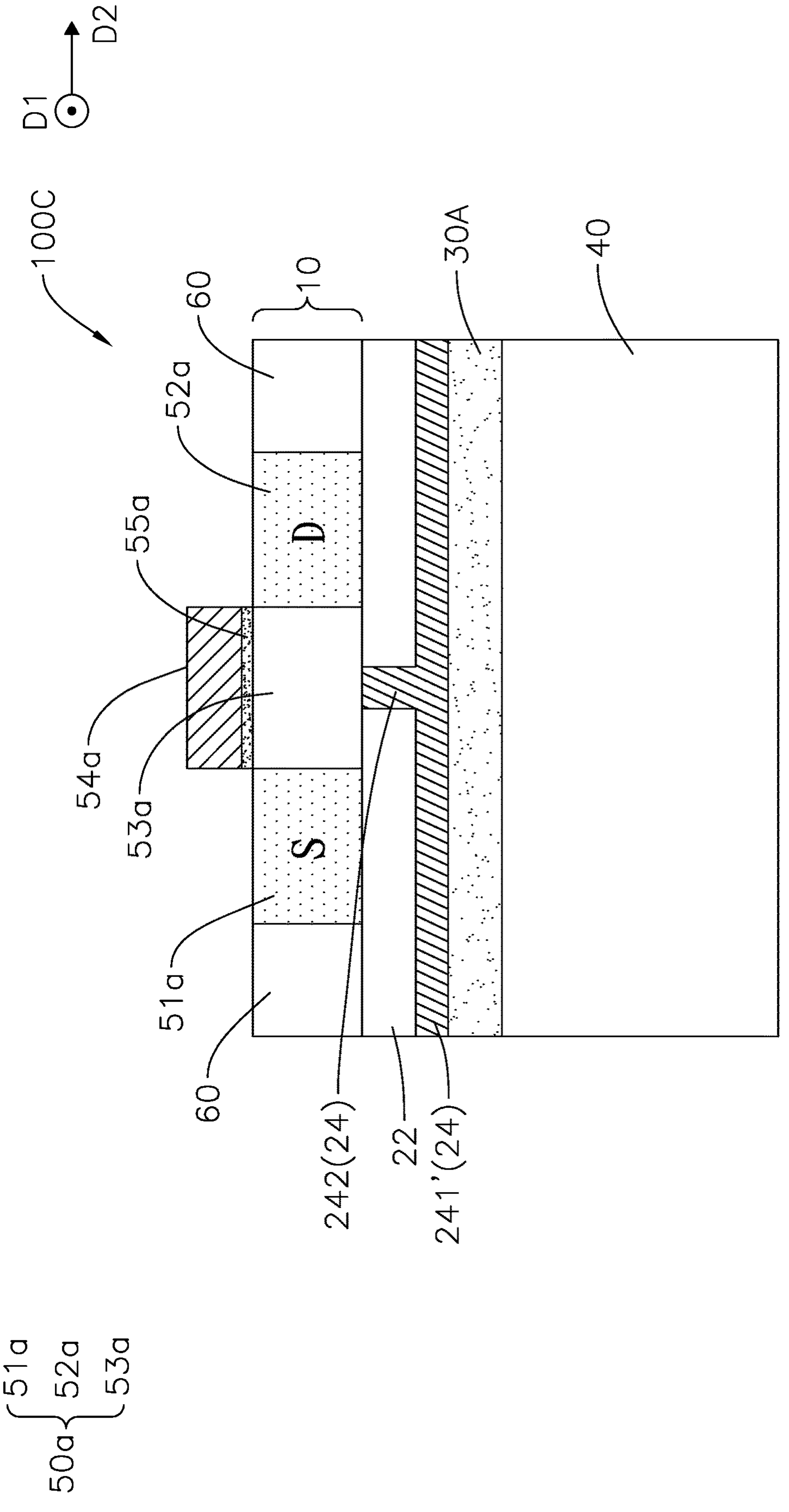
FIG. 6 is a schematic view to illustrate a semiconductor structure according to the present invention.

FIG. 6 is a schematic view to illustrate a semiconductor structure according to the present invention. Semiconductor structure 100C in FIG. 6 may be substantially similar to semiconductor structure 100B in FIG. 5 where like reference numerals indicate like elements. As shown in FIG. 6, a via portion 242 of the conducting structure 24 is spaced apart from the first source region 51*a*. In one embodiment, a width of the via portion 242 may be smaller than a width of the first gate 54*a*. The various intermediary stages of forming semiconductor structure 100C in FIG. 6 may be substantially similar to the process described above with respect to FIGS. 2A to 2G and FIGS. 3A to 3H, and additional description is omitted herein for brevity.

Figure 7:
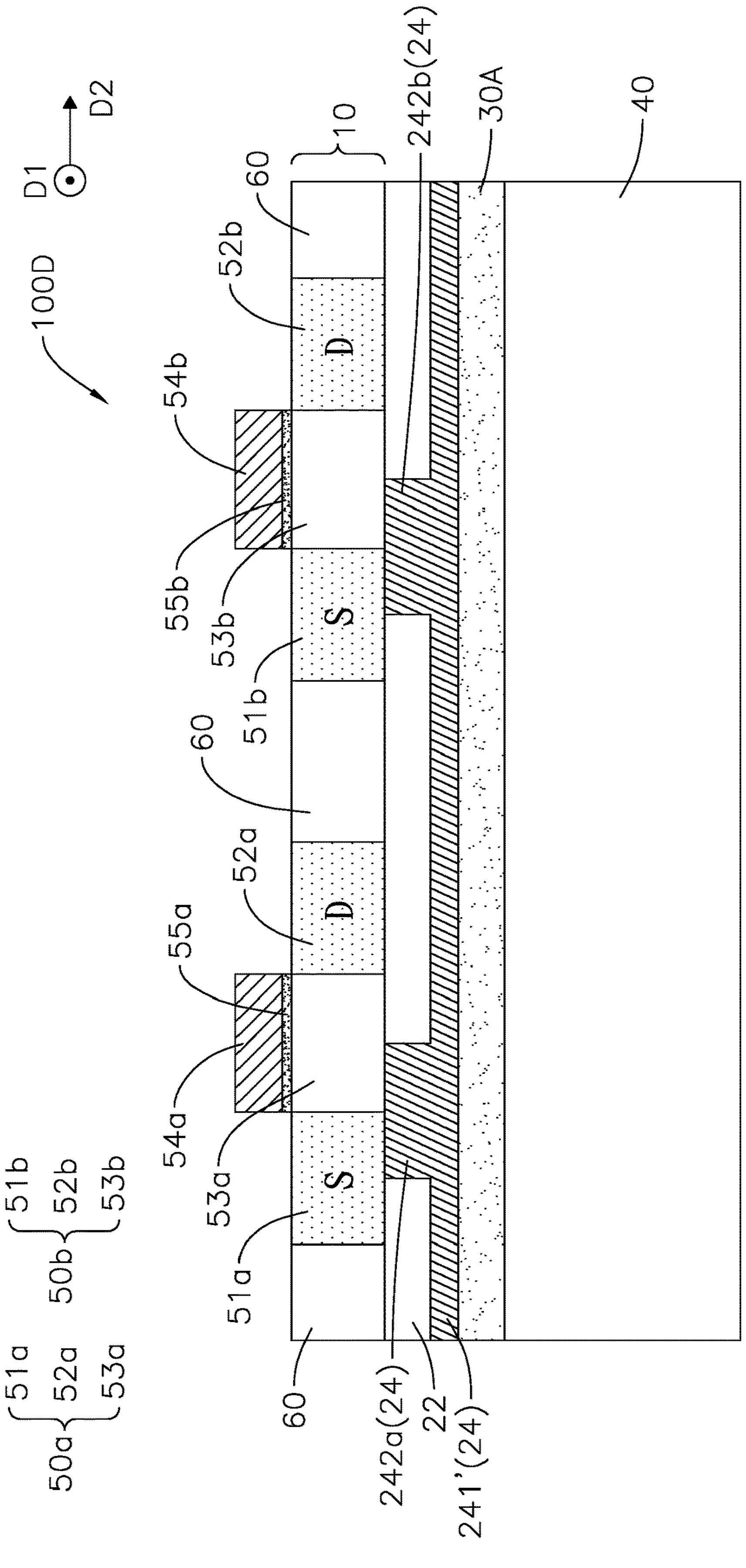
FIGS. 7 and 8 are schematic views to illustrate semiconductor structures according to the present invention.

FIG. 7 is a schematic view to illustrate a semiconductor structure according to the present invention. Semiconductor structure 100D in FIG. 7 may be substantially similar to semiconductor structure 100B in FIG. 5 where like reference numerals indicate like elements. As shown in FIG. 7, the first semiconductor layer 10 further comprises a second transistor 50*b*. The second transistor 50*b* may be substantially similar to the first transistor 50*a*. The second transistor 50*b* may comprise a second source region 51*b*, a second drain region 52*b*, and a second channel region 53*b*. The semiconductor structure 100D further comprises a second gate (gate conductor) 54*b* disposed over the first semiconductor layer 10 and a second gate insulator 55*b* disposed between the first semiconductor layer 10 and the second gate 54*b*. The second channel region 53*b* may be disposed under the second gate 54*b*, such that the second source region 51*b*, the second drain region 52*b*, the second channel region 53*b*, and the second gate 54*b* may function altogether as a MOSFET (FIG. 7 illustrates two planar FETs, however, the MOSTEFs can be FinFETs, Gate-all-around FETs, etc.). In one embodiment, the first transistor 50*a* and the second transistor 50*b* are partially depleted transistors. As shown in FIG. 7, second transistor 50*b* is spaced apart from the first transistor 50*a* by the shallow trench isolation 60.

As shown in FIG. 7, the conducting structure 24 comprises metal and is in contact with the first semiconductor layer 10. Specifically, the conducting structure 24 is disposed over the first insulation layer 30A and under the first channel region 53*a* and the second channel region 53*b*. In an embodiment shown in FIG. 7, the conducting structure 24 has a first via portion 242*a* and a second via portion 242*b* respectively under the first channel region 53*a* and the second channel region 53*b* to be in contact with the first semiconductor layer 10. Both the first via portion 242*a* and the second via portion 242*b* are spaced apart from the first drain region 52*a* and the second drain region 52*b*. In an embodiment shown in FIG. 7, the first via portion 242*a* and the second via portion 242*b* are in contact with the first source region 51*a* and the second source region 51*b* respectively. In another embodiment, the first via portion 242*a* and the second via portion 242*b* may be spaced apart from the first source region 51*a* and the second source region 51*b*.

As shown in FIG. 7, the first gate 54*a* and the second gate 54*b* extend in a first direction D1 respectively, and the first transistor 50*a* and the second transistor 50*b* are arranged alongside in a second direction D2 perpendicular to the first direction D1. The conducting structure 24 may comprises a conducting line portion 241 extending in the second direction D2, such that the charge accumulated in the first channel region 53*a* and the second channel region 53*b* can be removed through the conducting line portion 241 through the first via portion 242*a* and the second via portion 242*b*, respectively. The various intermediary stages of forming semiconductor structure 100D in FIG. 7 may be substantially similar to the process described above with respect to FIGS. 2A to 2G and FIGS. 3A to 3H, and additional description is omitted herein for brevity.

Figure 8:
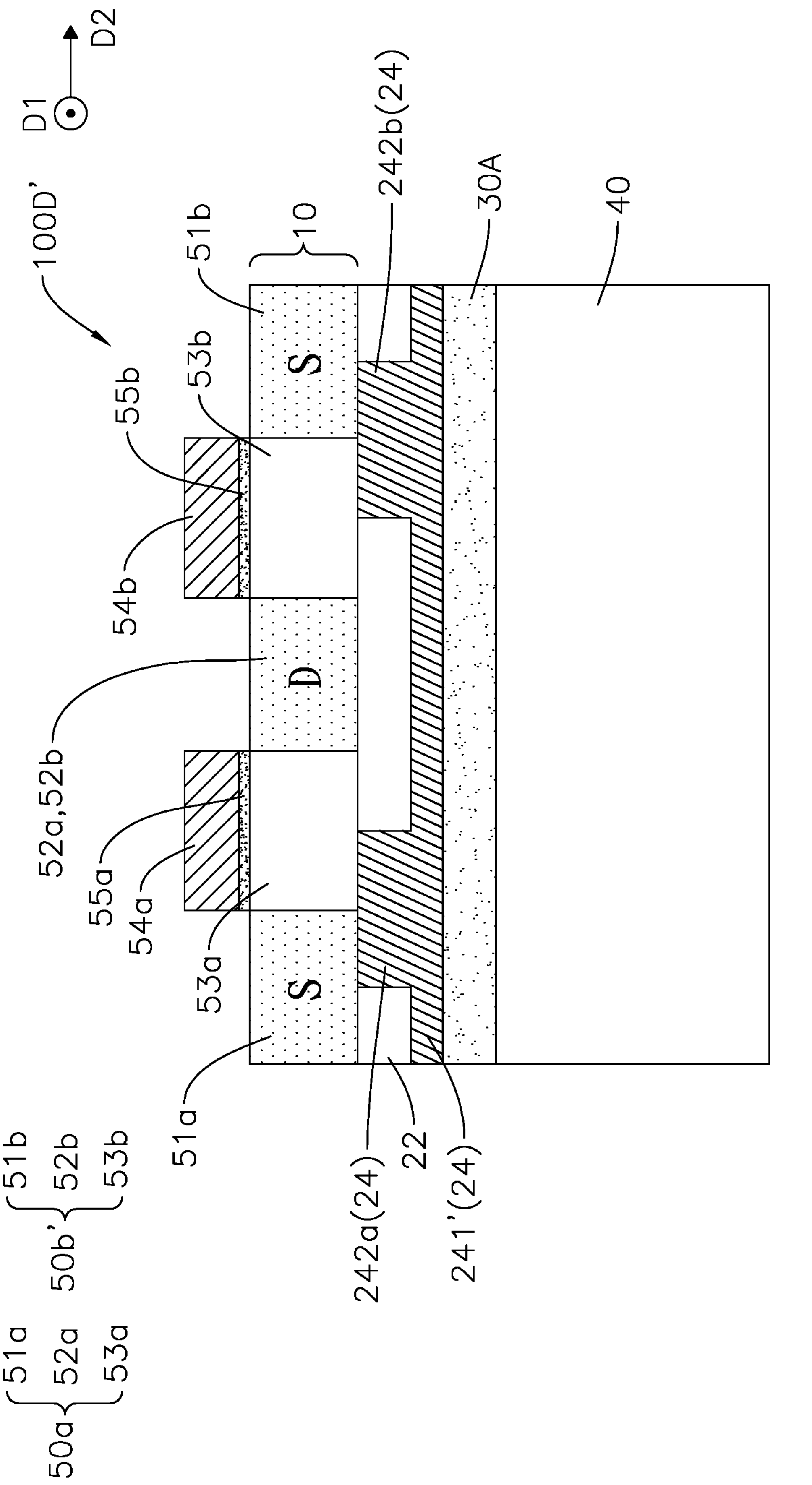

FIG. 8 is a schematic view to illustrate another semiconductor structure according to the present invention. Semiconductor structure 100D' in FIG. 8 may be substantially similar to semiconductor structure 100D in FIG. 7 where like reference numerals indicate like elements. As shown in FIG. 8, the second transistor 50*b*' may comprise a second source region 51*b*, a second drain region 52*b*, and a second channel region 53*b*, wherein the first transistor 50*a* and the second transistor 50*b*' shares the drain region, and the first transistor 50*a* and the second transistor 50*b*' are not spaced apart from each other by shallow trench isolation 60. The various intermediary stages of forming semiconductor structure 100D' in FIG. 8 may be substantially similar to the process described above with respect to FIGS. 2A to 2G and FIGS. 3A to 3H, and additional description is omitted herein for brevity.

Figure 9:
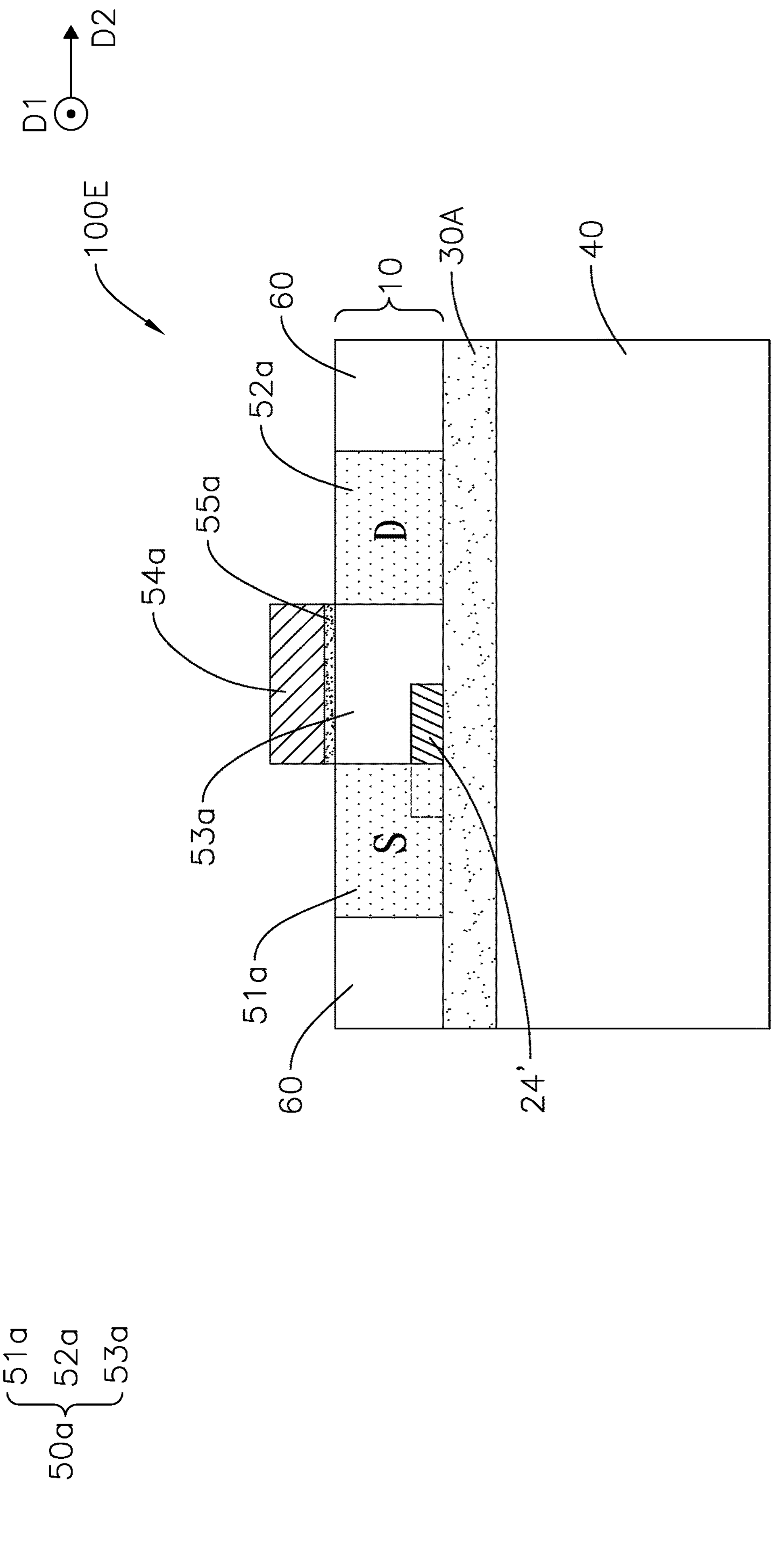
FIG. 9 is a schematic view to illustrate a semiconductor structure according to the present invention.

FIG. 9 is a schematic view to illustrate a semiconductor structure according to the present invention. Semiconductor structure 100E in FIG. 9 may be substantially similar to semiconductor structure 100 in FIG. 1 where like reference numerals indicate like elements. As shown in FIG. 9, the semiconductor structure 100E comprises a first insulation layer 30A, a first semiconductor layer 10, which may be a single crystalline substrate, over the first insulation layer 30A, and a conducting structure 24'. The first source region 51*a* and the first drain region 52*a* of the first transistor 50*a* extend through the thickness of the first semiconductor layer 10 and are in contact with the first insulation layer 30A.

In an embodiment shown in FIG. 9, the conducting structure 24' comprises heavily doped semiconductor and is within the first semiconductor layer 10. The conducting structure 24' may be disposed under the first channel region 53*a*, or, in other words, in a region close to the bottom of the first semiconductor layer 10, and the conducting structure 24' may be disposed over the first insulation layer 30A. The conducting structure 24' may extend in the first direction D1. As such, the charge accumulated in the first semiconductor layer 10, e.g., in the first channel region 53*a* may be removed by the conducting structure 24'. As shown in FIG. 9 the conducting structure 24' is spaced apart from the first drain region 52*a*.

In one embodiment, the first source region 51*a* and the first drain region 52*a* include a first type of dopant (e.g., n-type dopant), and the first channel region 53*a* includes a second type of dopant (e.g., p-type dopant) different from the first type of dopant. In such embodiment, the conducting structure 24' may include a second type of dopant (e.g., p-type dopant). In one embodiment, the doping concentration of the conducting structure 24' is higher than the doping concentration of the first channel region 53*a*.

FIGS. 10A to 10G are schematic views to illustrate intermediate stages in the manufacture of a semiconductor structure similar to the semiconductor structure as shown in FIG. 9 according to the present invention.

Figure 10A:
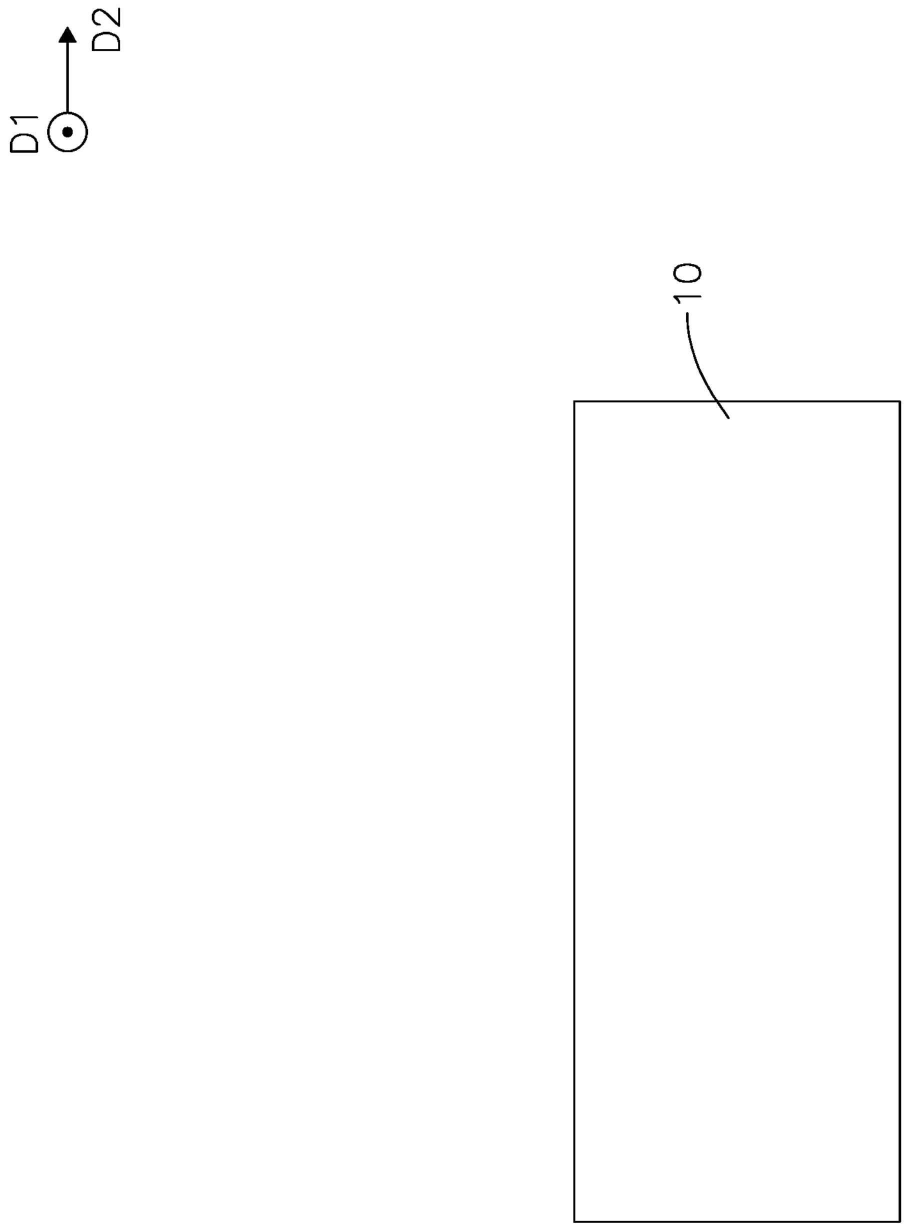
FIGS. 10A to 10G are schematic views to illustrate intermediate stages in the manufacture of a semiconductor structure similar to the semiconductor structure as shown in FIG. 9 according to the present invention.

As shown in FIG. 10A, a first substrate 10 is provided (step (a1)). The first substrate 10 may be similar to the first substrate 10 described above with regard to FIG. 2A.

Figure 10B:
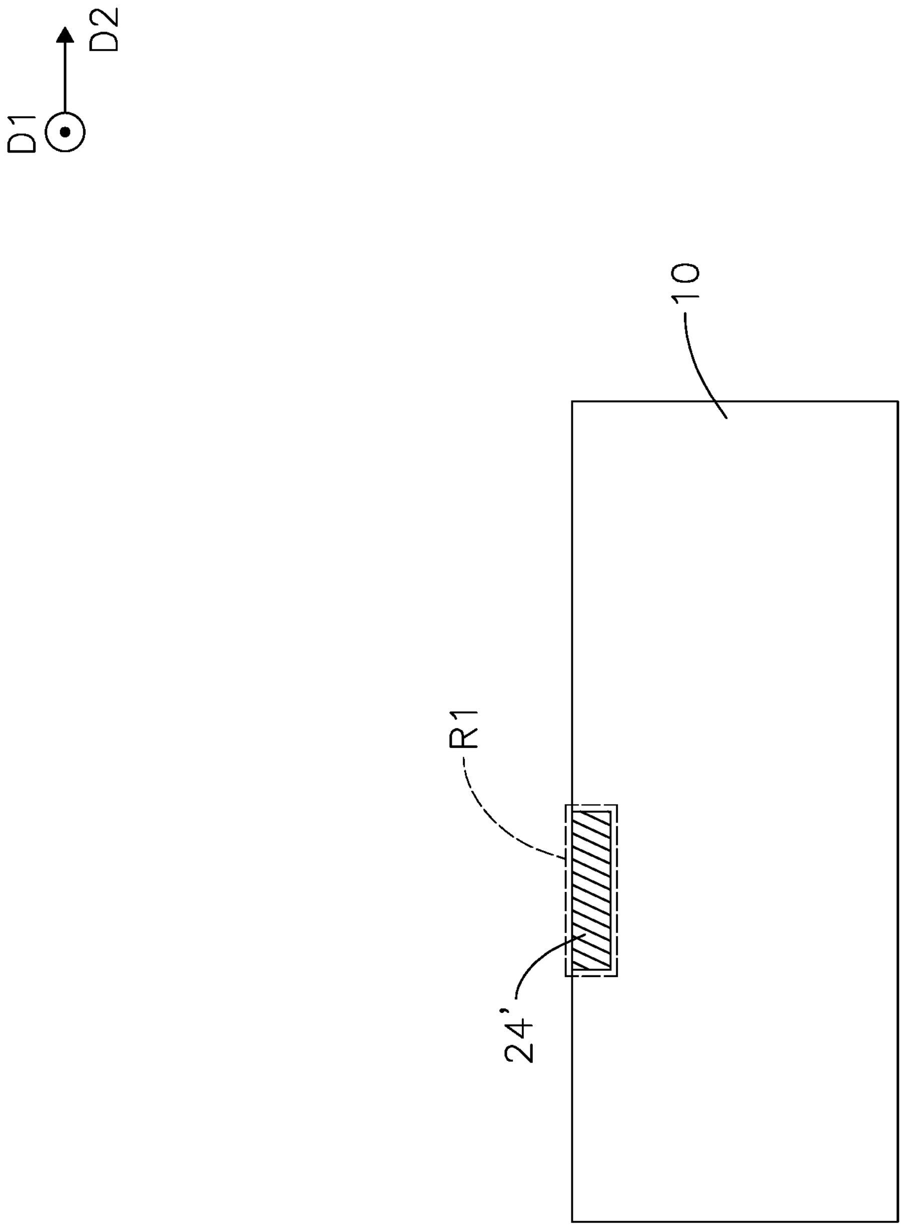

As shown in FIG. 10B, a conducting structure 24' is formed in the first substrate 10 (step (a2)). The conducting structure 24' may comprise heavily doped semiconductor and may be formed by implanting a second type of dopant (e.g., p-type dopant) into a first region R1 of the first substrate 10. As such, the conducting structure 24' is formed within the first substrate 10. In one embodiment, the step (a2) further comprises annealing the first substrate 10 after the implantation of the conducting structure 24'. The conducting structure 24' may be provided with different patterns, for example, the conducting structure 24' may be a conducting line portion extending in the first direction D1, as shown in FIG. 10B.

Figure 10C:
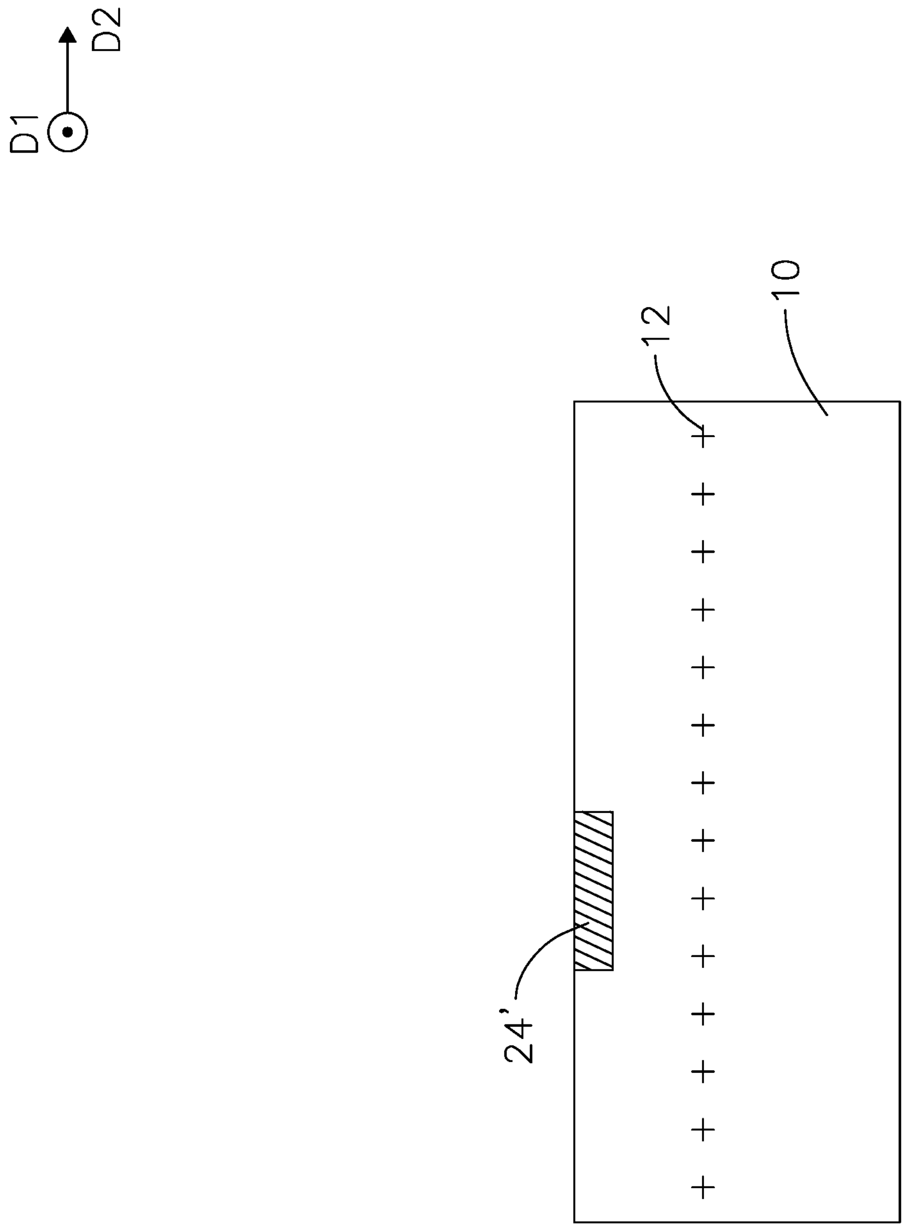

As shown in FIG. 10C, a hydrogen layer 12 is implanted into the first substrate 10 (step (a3)). The implantation may be conducted under the condition described above with respect to FIG. 2B. The conducting structure 24' may be formed before or after the implantation of the hydrogen layer 12, as long as the hydrogen layer 12 will not be damaged by the succeeding processes. However, in one embodiment, the conducting structure 24' may be formed before the implantation of the hydrogen layer 12, given the annealing process after the implantation process may involve exposing the first substrate 10 under high temperature.

Figure 10D:
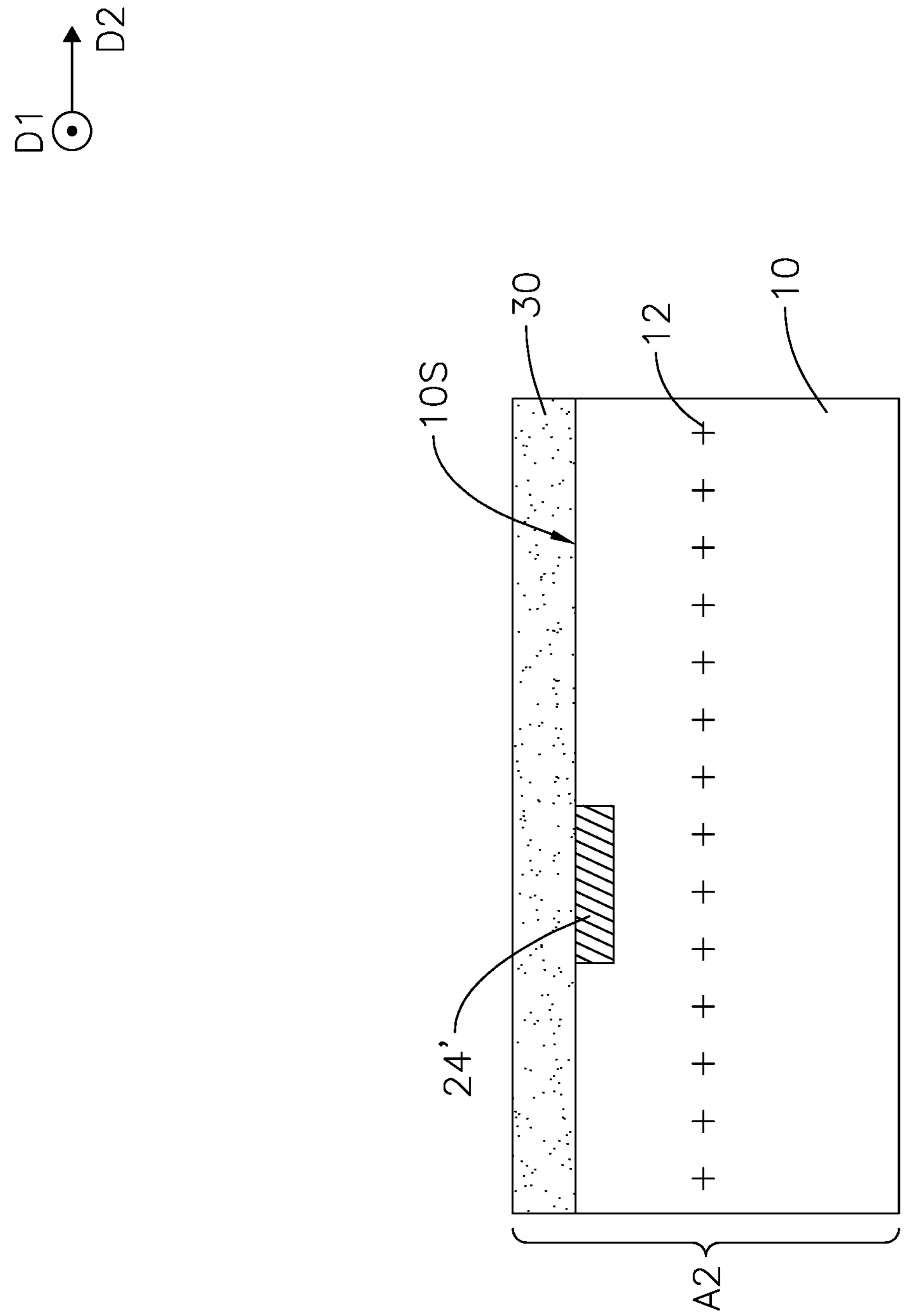

As shown in FIG. 10D, a first insulation layer 30 is formed on the first substrate 10 (step (a4)). The first insulation layer 30 may comprise at least one dielectric sublayer, such as an oxide layer, and may be formed by deposition such as CVD or PVD on the top surface 10S of the first substrate 10 and on the conducting structure 24'. As such, the first insulation layer 30 is formed in contact with the first substrate 10, as shown in FIG. 10D. After the formation of the first insulation layer 30, a first structure A1 is provided. The first structure A1 comprises a first substrate 10, a first insulation layer 30 on the first substrate 10, and a conducting structure 24' within the first substrate 10.

Figure 10E:
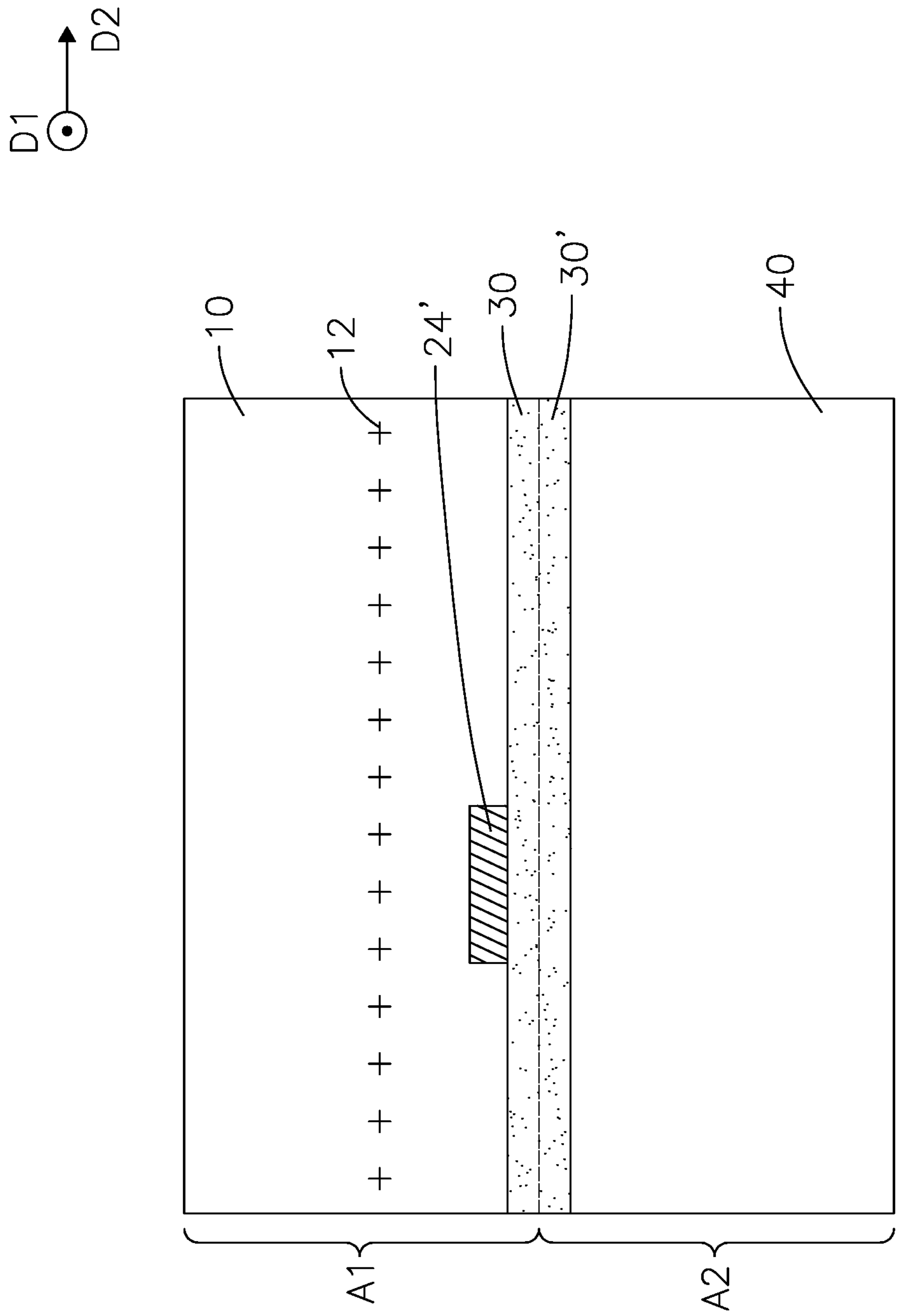

As shown in FIG. 10E, a second structure A2 is provided. The second structure A2 comprises a second substrate 40. the second substrate 40 may be similar to the second substrate described above with regard to FIG. 2E. The first structure A1 is flipped and bonded onto the second structure A2 by the first insulation layer 30 to form a bonded structure, as shown in FIG. 2E. The second structure A2 may further include a second insulation layer 30' formed on the second substrate 40 before bonding. The first structure A1 and the second structure A2 may be bonded by process(es) similar to that of described above with regard to FIG. 2E.

Figure 10F:
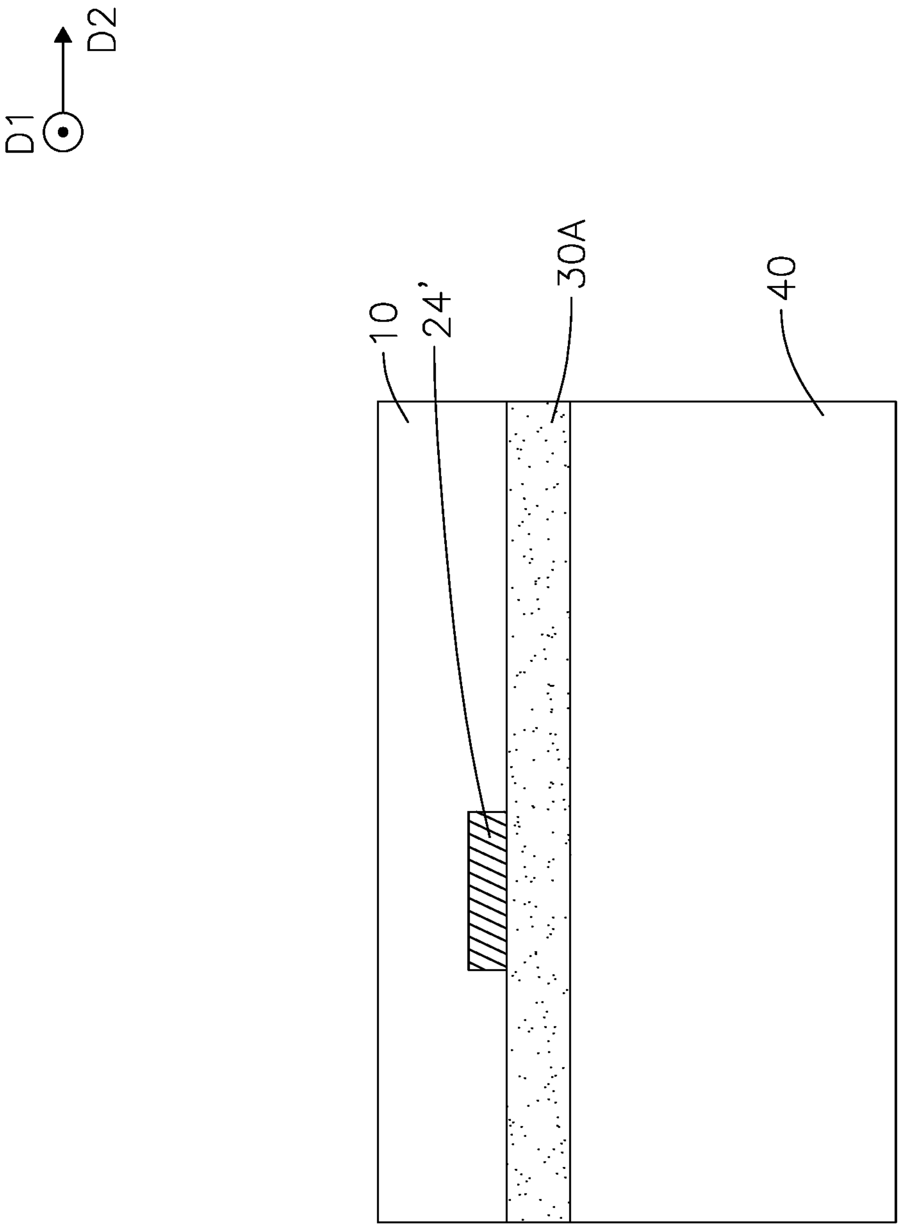

As shown in FIG. 10F, a portion of the first substrate 10 is removed from the bonded structure from approximately the depth of the implanted hydrogen layer 12. The portion of the first substrate 10 may be removed by process(es) similar to that of described above with regard to FIG. 2F. CMP process or etching process may also be performed to minimize non-uniformity after the removal.

Figure 10G:
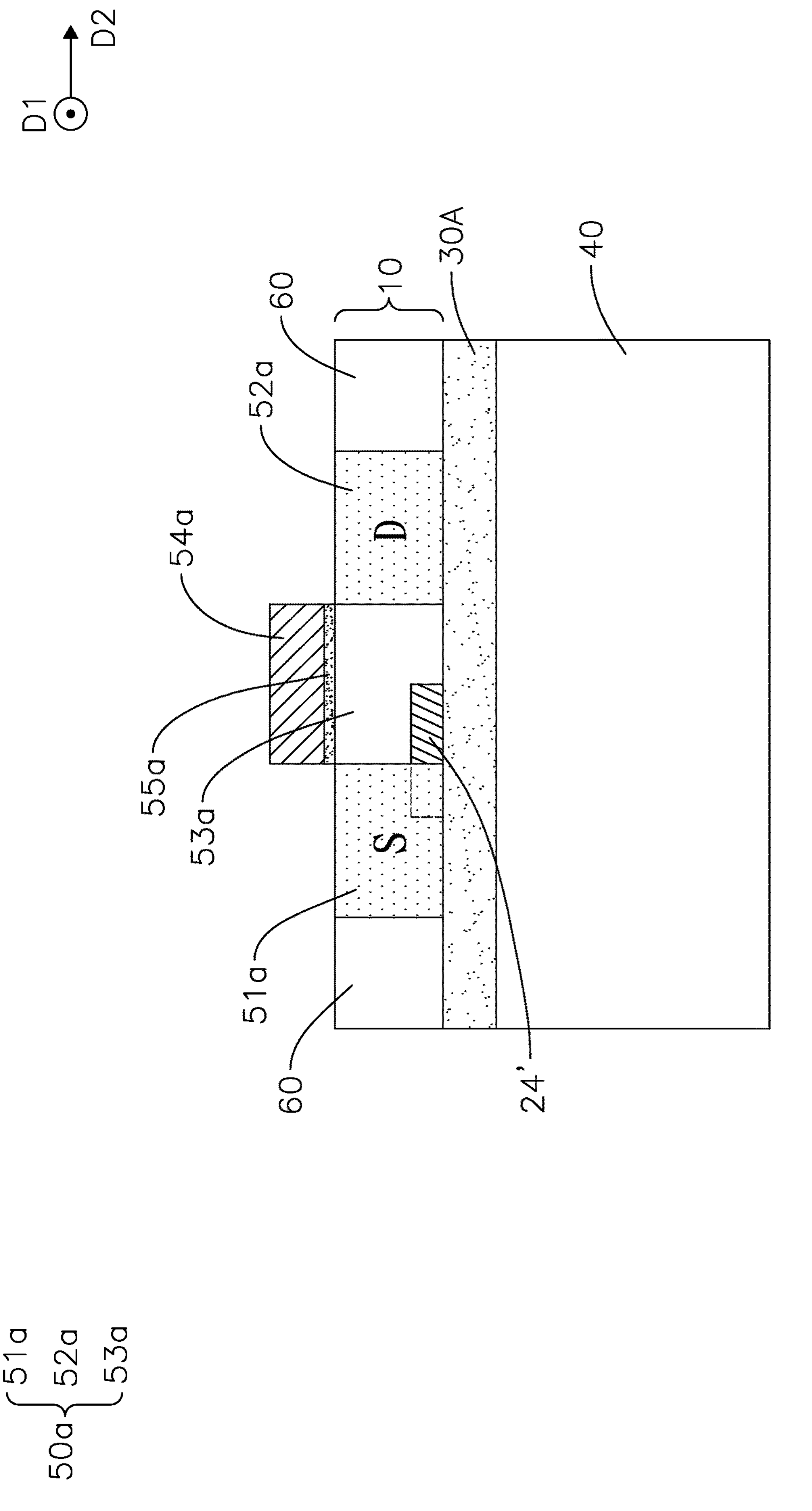

Then, an electronic component, for example, a first transistor 50*a*, may be formed in the first substrate 10, as shown in FIG. 10G. The first transistor 50*a* may be similar to the first transistor 50*a* described above with regard to FIG. 1 and may be formed by conventional methods known in the art. As such, the semiconductor structure as shown 100E in FIG. 9 is formed. As shown in FIG. 10G, the first transistor 50*a* is formed in a position such that the conducting structure 24' is overlapped with the first source region 51*a*.

Figure 11:
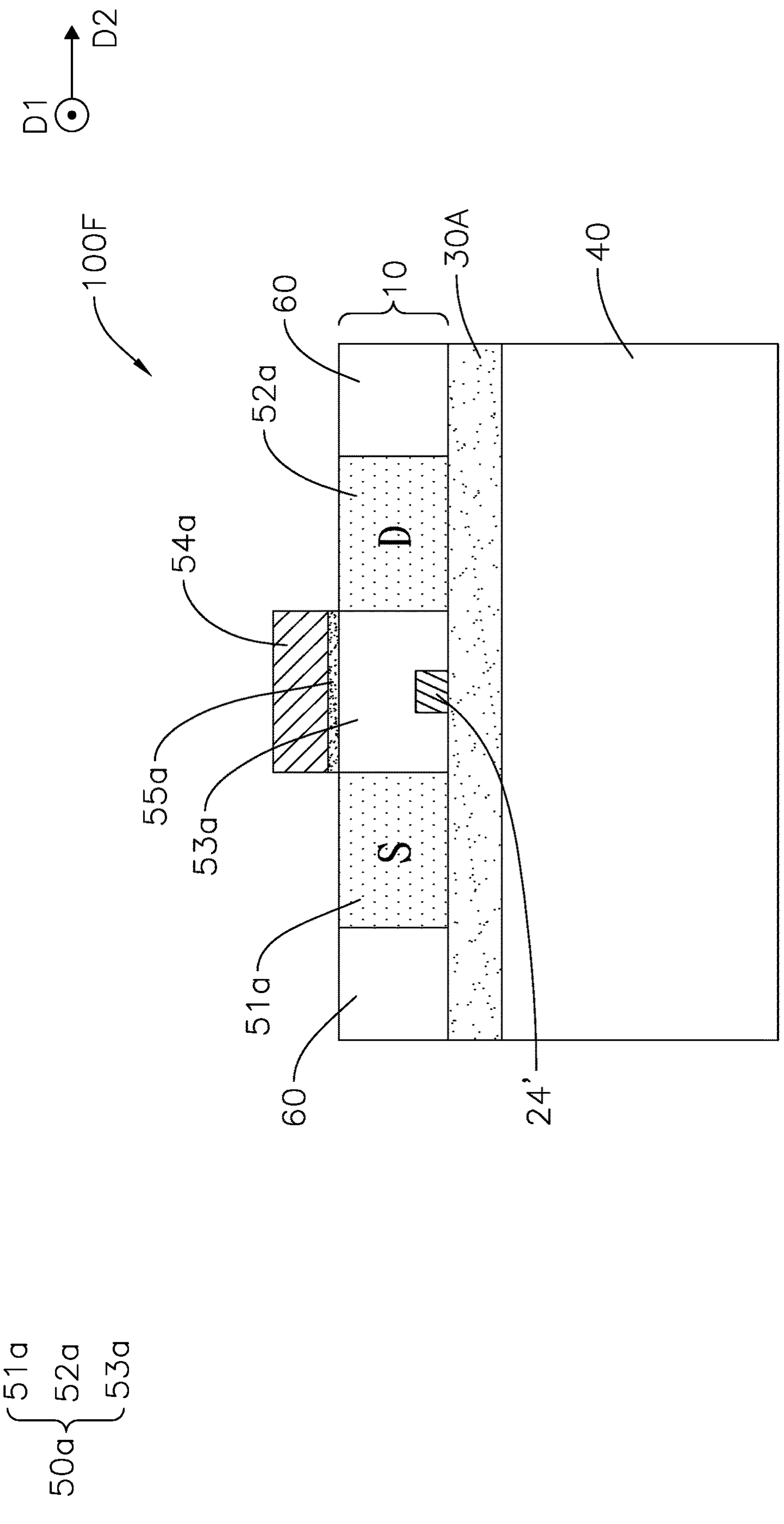
FIG. 11 is a schematic view to illustrate a semiconductor structure according to the present invention.

FIG. 11 is a schematic view to illustrate a semiconductor structure according to the present invention. Semiconductor structure 100F in FIG. 11 may be substantially similar to semiconductor structure 100E in FIG. 9 where like reference numerals indicate like elements. As shown in FIG. 11, the conducting structure 24' is spaced apart from the first source region 51*a*. In one embodiment, a width of the conducting structure 24' may be smaller than a width of the first gate 54*a*. The various intermediary stages of forming semiconductor structure 100F in FIG. 9 may be substantially similar to the process described above with respect to FIGS. 10A to 10G, and additional description is omitted herein for brevity.

Figure 12A:
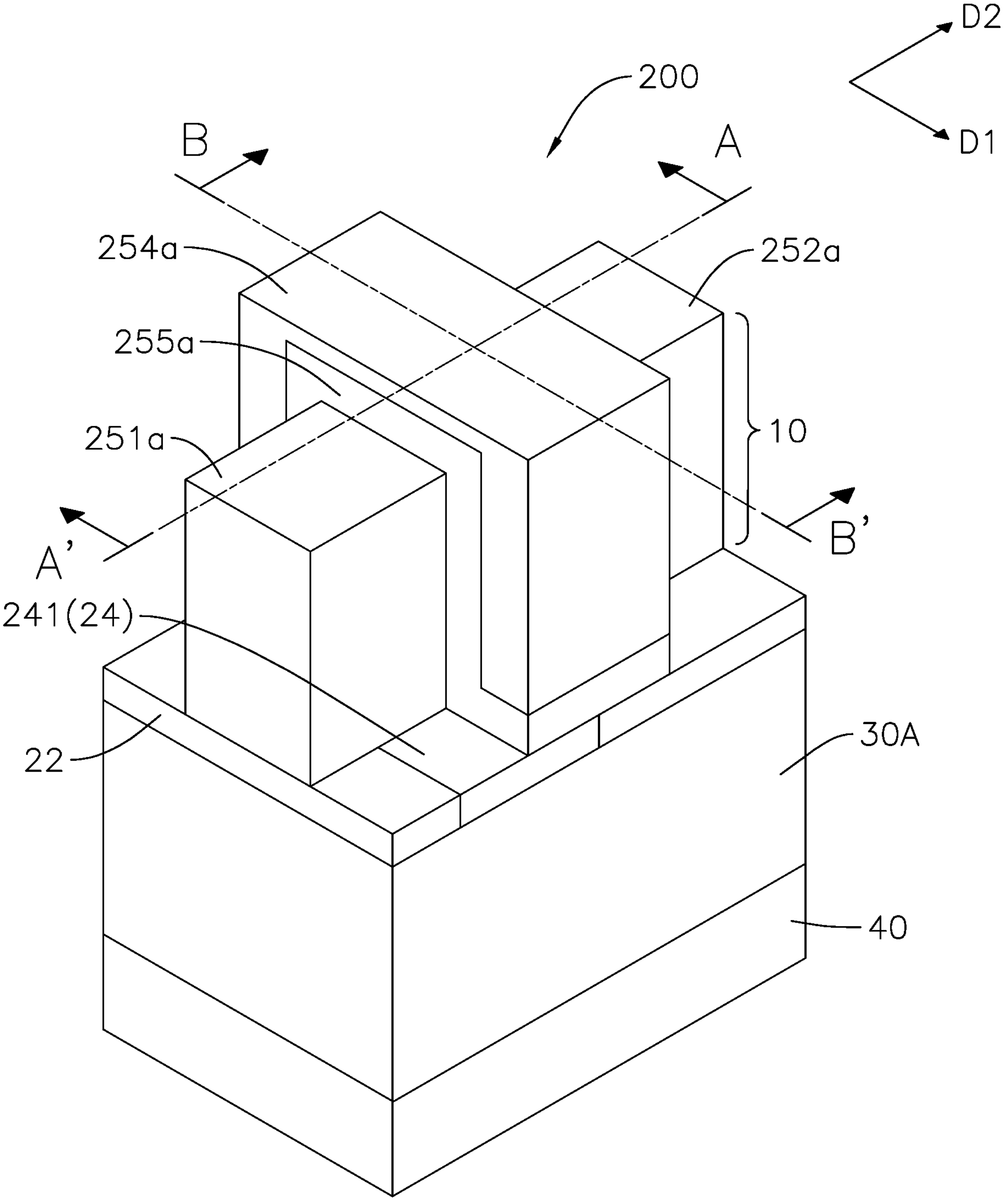
FIGS. 12A to 12C are schematic views to illustrate a semiconductor structure according to the present invention.
Figure 12B:
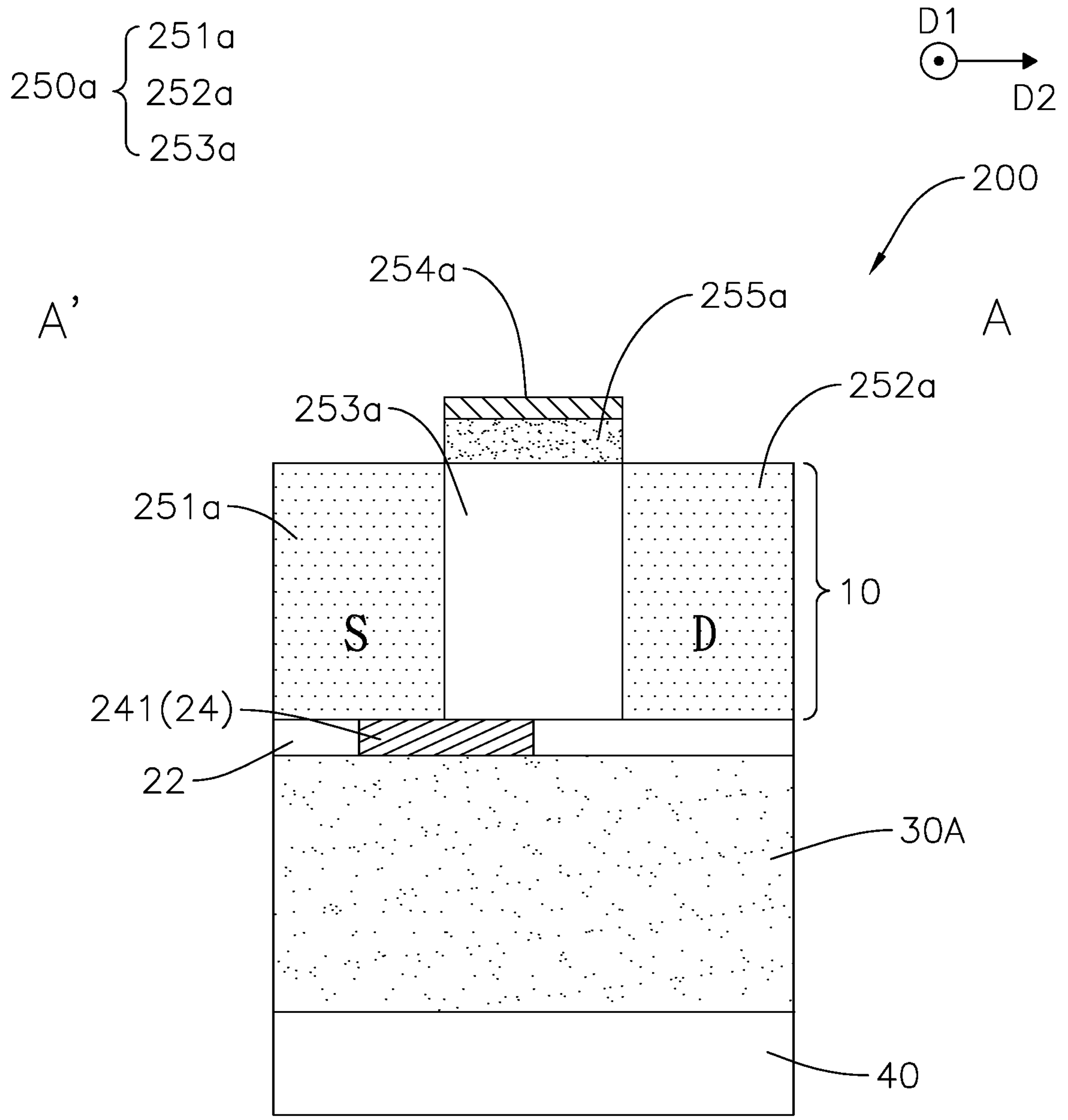
Figure 12C:
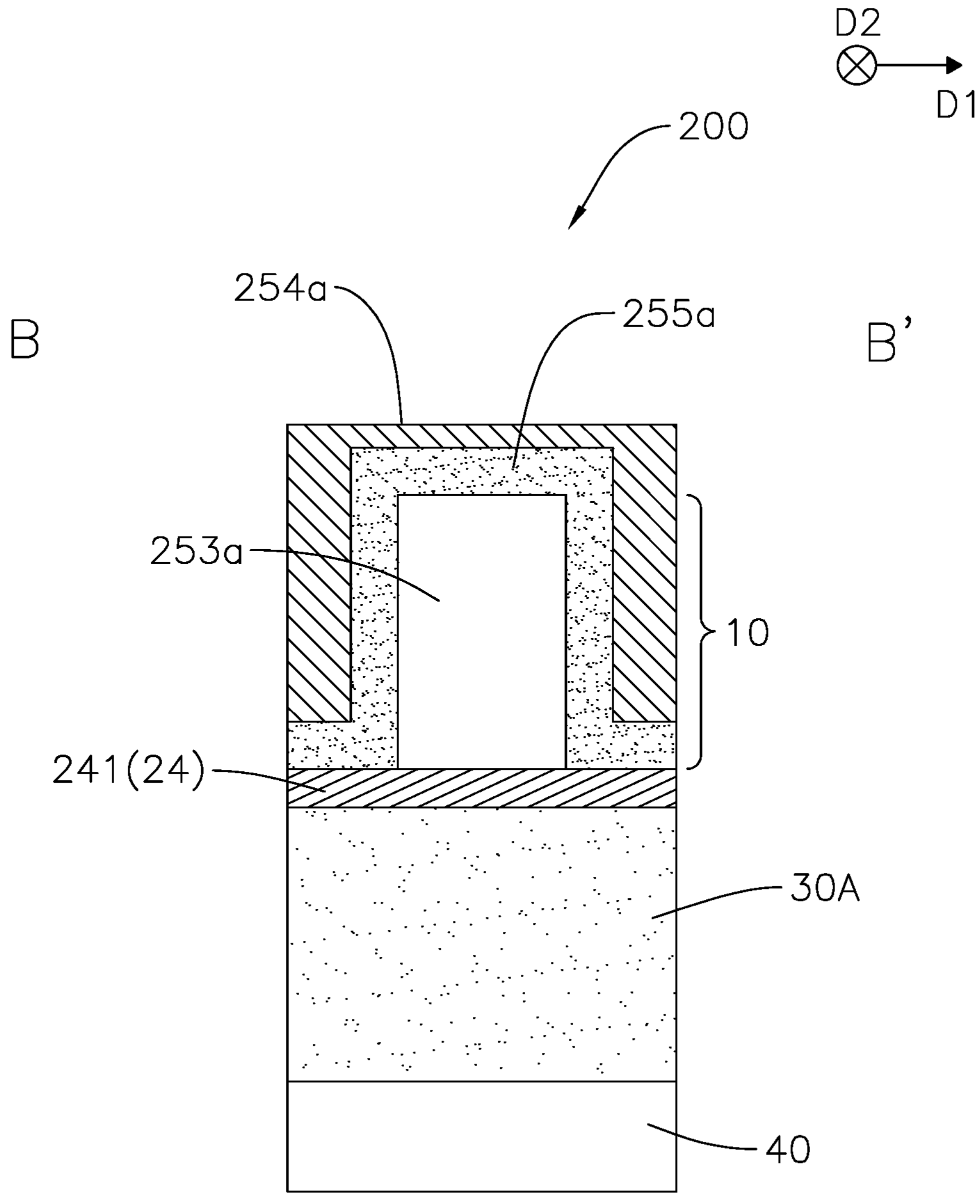

FIGS. 12A to 12C are schematic views to illustrate a semiconductor structure according to the present invention. FIG. 12A is a perspective view of a semiconductor structure 200, FIG. 12B is a cross-sectional view of the semiconductor structure 200 in FIG. 12A along line A-A', and FIG. 12C is a cross-sectional view of the semiconductor structure 200 in FIG. 12A along line B-B'. Semiconductor structure 200 in FIGS. 12A to 12C may be substantially similar to semiconductor structure 100 in FIG. 1 where like reference numerals indicate like elements. As shown in FIGS. 12A to 12C, the first semiconductor layer 10 comprises a first transistor 250*a*. The first transistor 250*a* comprises a first source region 251*a*, a first drain region 252*a*, and a first channel region 253*a*. The first source region 251*a* and the first drain region 252*a* are spaced apart from each other with the first channel region 253*a* located therebetween. The first source region 251*a* and the first drain region 252*a* may comprise similar materials as described above for the first source region 51*a* and the first drain region 52*a*, and the first channel region 253*a* may comprise similar materials as described above for the first channel region 53*a*.

The semiconductor structure 200 further comprises a first gate (gate conductor) 254*a* disposed over and around the first channel region 253*a* and a first gate insulator 255*a* disposed between the first channel region 253*a* and the first gate 254*a*. The first gate 254*a* may comprise similar materials and/or structures as described above for the first gate 54*a*, and the first gate insulator 255*a* may comprise similar materials as described above for the first gate insulator 55*a*. As shown in FIGS. 12A to 12C, the first semiconductor layer 10 have a fin structure, and the first semiconductor layer 10 is wrapped around by the first gate 254*a* and the first gate insulator 255*a*, such that first source region 251*a*, the first drain region 252*a*, and the first channel region 253*a*, and the first gate 254*a* may function altogether as a fin field-effect transistor (FinFET).

As shown in FIGS. 12A to 12C, a conducting structure 24 is disposed under the first channel region 253*a* and over the first insulation layer 30A. The conducting structure 24 is in contact with and electrically connected to the first semiconductor layer 10 and is grounded or electrically connected to a power supply or a source region of the first transistor 250*a* or other device, such that the charge accumulated in the first channel region 253*a* may be removed through the conducting structure 24, and the floating body effect in the first transistor 250*a* may be reduced. The conducting structure 24 may also be in contact with the first source region 251*a*. As shown in FIGS. 12A and 12C, the first gate 254*a* is spaced apart from the conducting structure 24 by dielectric material such as a portion of the first gate insulator 255*a*.

In an embodiment shown in FIGS. 12A to 12C, the conducting structure 24 includes a conducting line portion 241 extending in the first direction D1. In other embodiments, different structures of the conducting structure 24 described above may be applied to semiconductor structure 200 if applicable. For example, the conducting structure 24 may further include a via portion disposed under and in contact with the first channel region 253*a* for electrical connection between a conducting line portion of the conducting structure 24 and the first channel region 253*a*. The various intermediary stages of forming semiconductor structure 200 in FIGS. 12A to 12C may be substantially similar to the process described above with respect to FIGS. 2A to 2G and FIGS. 3A to 3H, and additional description is omitted herein for brevity.

In the embodiment shown in FIGS. 12A to 12C, the semiconductor structure 200 includes a first insulation layer 30A (e.g., the buried oxide of an SOI substrate) and the second substrate 40. However, in another embodiment, removal processes similar to that of described above with regard to FIG. 3F may be performed during manufacturing of the semiconductor structure and the resulting semiconductor structure 200 may not include the second substrate 40, and the buried oxide of the SOI substrate may also be removed. In such embodiment, the first insulation layer 30A may be a protection layer formed on the conducting structure 24.

Figure 13A:
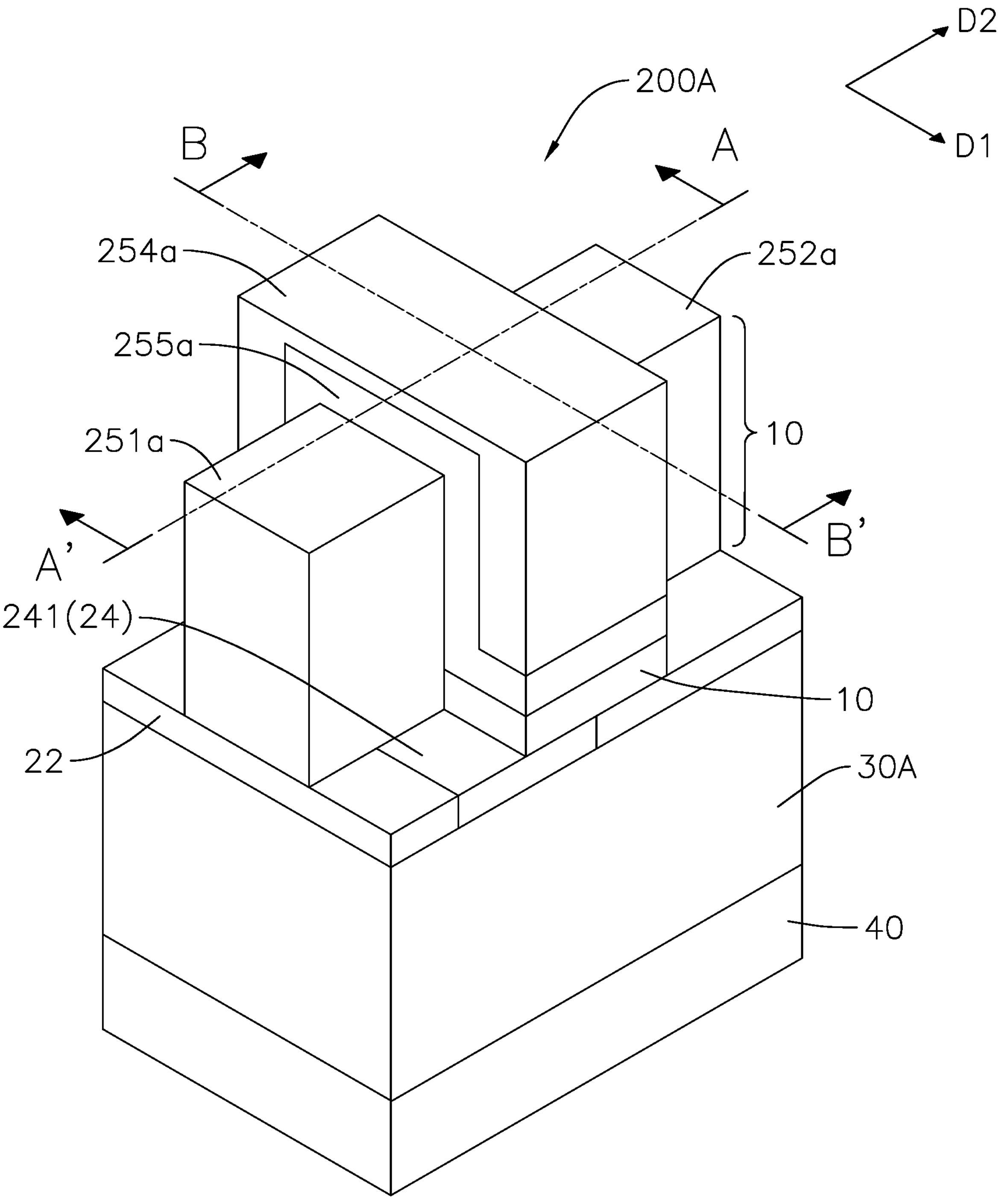
FIGS. 13A to 13C are schematic views to illustrate a semiconductor structure according to the present invention.
Figure 13B:
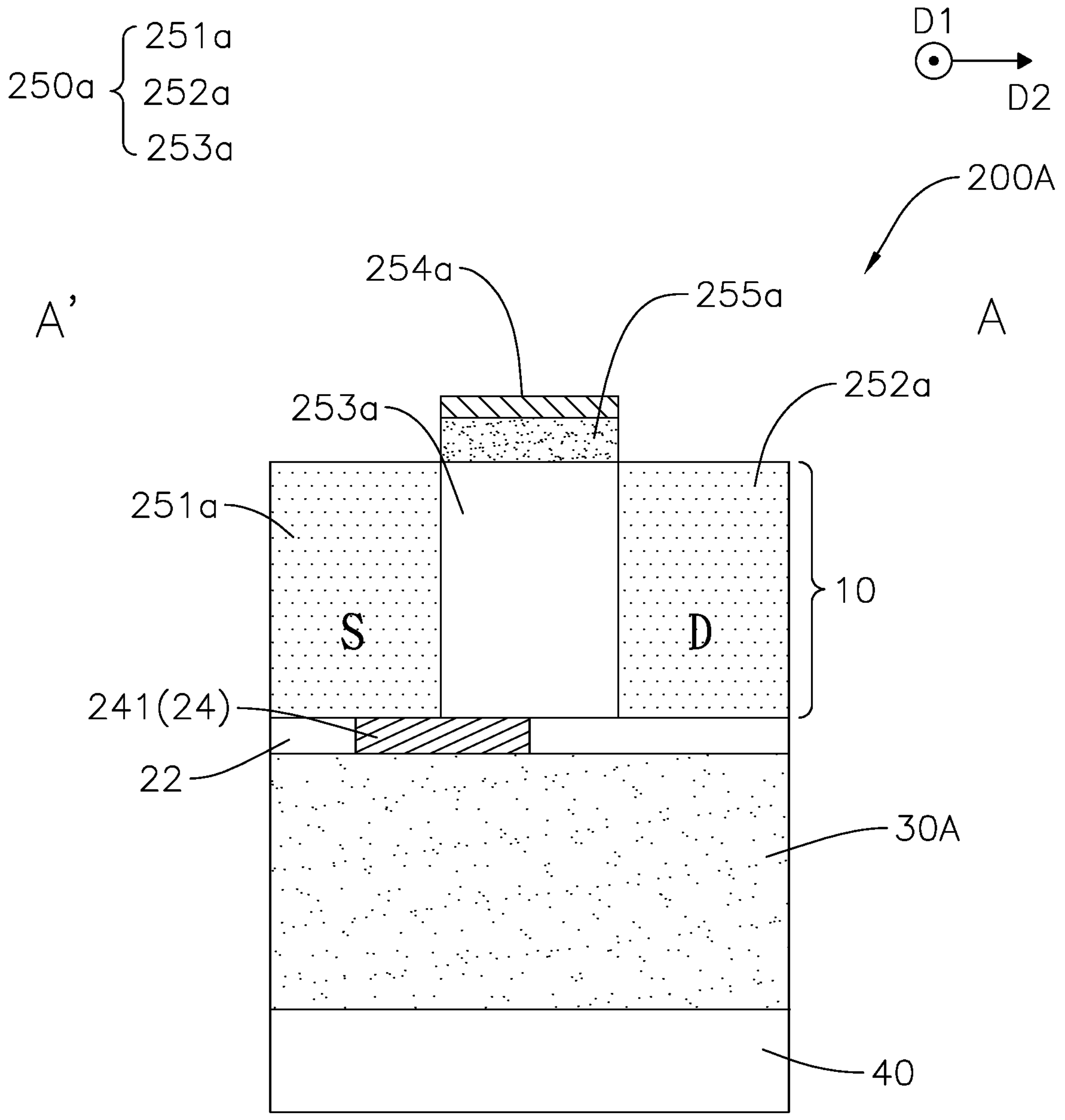
Figure 13C:
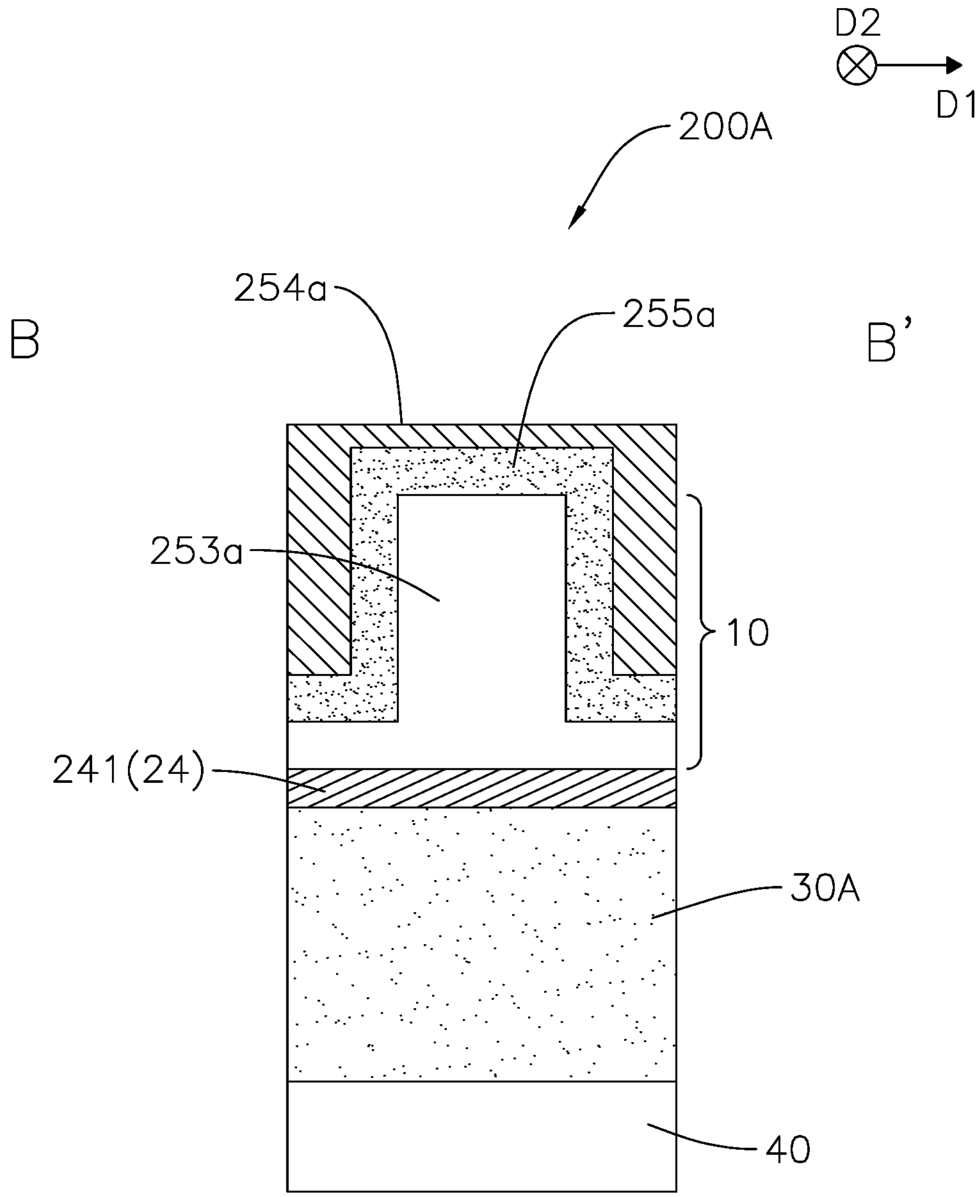

FIGS. 13A to 13C are schematic views to illustrate a semiconductor structure according to the present invention. FIG. 13A is a perspective view of a semiconductor structure 200A, FIG. 13B is a cross-sectional view of the semiconductor structure 200A in FIG. 13A along line A-A', and FIG. 13C is a cross-sectional view of the semiconductor structure 200A in FIG. 13A along line B-B'. Semiconductor structure 200A in FIGS. 13A to 13C may be substantially similar to semiconductor structure 200 in FIGS. 12A to 12C where like reference numerals indicate like elements. As shown in FIGS. 13A and 13C, the first gate insulator 255*a* is not in contact with the dielectric layer 22 and the conducting structure 24 with a portion of the first semiconductor layer therebetween. The various intermediary stages of forming semiconductor structure 200A in FIGS. 13A to 13C may be substantially similar to the process described above with respect to FIGS. 2A to 2G and FIGS. 3A to 3H, and additional description is omitted herein for brevity.

In the embodiments where the removal processes similar to that of described above with regard to FIG. 3F are performed during manufacturing of the semiconductor structure, the semiconductor structure 200A may not include the second substrate 40, and the first insulation layer 30A may be a protection layer formed on the conducting structure 24. The semiconductor structures and methods of making the same described above has one or more of the following advantages.

1. The semiconductor structures according to the present invention may include an insulation layer and a semiconductor layer comprising electronic component(s) (for example, transistor(s)) over the insulation layer. As such, the electronic component(s) may have increased device performance and reduced overall power consumption, since the junction capacitances are reduced by the insulation layer.

2. The semiconductor structures according to the present invention may include a semiconductor layer of a thickness between 5 nm and 200 nm and may include partially depleted transistor(s). As such, the semiconductor structures may subject to less threshold voltage fluctuation due to less thickness variation of the semiconductor layer, and the manufacturing of the semiconductor structures may be cost effective.
3. The semiconductor structures according to the present invention may include a conducting structure disposed either within or in contact with the first semiconductor layer. The conducting structure may be electrically connected to a channel region of a transistor and meanwhile be grounded or electrically connected to a power supply. In one embodiment, the conducting structure can be grounded through electrically connecting to the source region of the transistor or a source region of another transistor or device. As such, the carriers (for example, holes) accumulated in the channel region of the transistor can be removed through the conducting structure, and the floating body effect in the transistor may be reduced.
4. The semiconductor structures according to the present invention may include at least two transistors, and the conducting structure may be electrically connected to the channel regions of both the first and the second transistor. In one embodiment, the conducting structure may include a conducting line portion extending across a plurality of electronic component(s). As such, the floating body effect in a plurality of the transistors may be reduced by the conducting structure. The number of transistors/electronic components electrically connected to the conducting structure is unlimited.
5. The conducting structure according to the present invention may be spaced apart from the drain region of the transistor. As such, the additional conducting structure would not interfere with the functionality of the transistor. In one embodiment, the conducting structure is either in contact with or partially overlapped with the source region of the transistor. As such, the conducting structure can be incorporated in a transistor with the width of the gate conductor substantially equal to the critical dimension of the lithographic process performed.
6. The conducting structure according to the present invention may comprise metal. As such, the conducting structure may provide better conductivity for releasing the accumulated carriers.
7. The conducting structure according to the present invention may comprise heavily doped semiconductor. As such, the semiconductor structure does not involve additional layers. In some embodiments, the conducting structure includes a second type of dopant (for example, p-type), which is different from that of the source region and the drain region of the transistor.
8. The methods according to the present invention provide processes through which one skilled in the art can make the semiconductor structures as described above. As such, the semiconductor structures can be made in a cost-effective way.

The foregoing description of embodiments is provided to enable any person skilled in the art to make and use the subject matter. Various modifications to these embodiments will be readily apparent to those skilled in the art, and the novel principles and subject matter disclosed herein may be applied to other embodiments without the use of the innovative faculty. The claimed subject matter set forth in the claims is not intended to be limited to the embodiments shown herein but is to be accorded the widest scope consistent with the principles and novel features disclosed herein. It is contemplated that additional embodiments are within the spirit and true scope of the disclosed subject matter. Thus, it is intended that the present invention covers modifications and variations that come within the scope of the appended claims and their equivalents.

What is claimed is:

1. A semiconductor structure, comprising:

a first insulation layer;

a first semiconductor layer over the first insulation layer, the first semiconductor layer comprising a first transistor which comprises:

a first source region, a first drain region, and a first channel region between the first source region and the first drain region and under a first gate disposed over the first semiconductor layer;

a dielectric layer disposed between the first semiconductor layer and the first insulation layer, the first source region and the first drain region extending through the thickness of the first semiconductor layer and in contact with the dielectric layer; and a conducting structure formed in the dielectric layer and disposed under the first channel region, spaced apart from the first drain region, over the first insulation layer, and in contact with the first semiconductor layer.

2. The semiconductor structure of claim 1, wherein the first semiconductor layer further comprises a second transistor which comprises:

a second source region, a second drain region, and a second channel region under a second gate disposed over the first semiconductor layer; and wherein the conducting structure is disposed under the first channel region and the second channel region, spaced apart from the first drain region and the second drain region, over the first insulation layer, and in contact with the first semiconductor layer.

3. The semiconductor structure of claim 2, wherein the first transistor and the second transistor are partially depleted transistors.

4. The semiconductor structure of claim 2, wherein the conducting structure comprises metal and is in contact with the first semiconductor layer.

5. The semiconductor structure of claim 2, wherein the conducting structure is spaced apart from the first source region and the second source region.

6. The semiconductor structure of claim 2, wherein the conducting structure is either in contact with or partially overlapped with the first source region and the second source region.

7. The semiconductor structure of claim 2, wherein the conducting structure has a first via portion and a second via portion to be in contact with the first semiconductor layer respectively under the first channel region and the second channel region.

8. The semiconductor structure of claim 2, wherein the first gate extends in a first direction, the first transistor and the second transistor are arranged alongside in a second direction perpendicular to the first direction, and the conducting structure comprises a conducting line portion extending in the second direction.

9. The semiconductor structure of claim 1, wherein the first gate extends in a first direction, and the conducting structure comprises a conducting line portion extending in the first direction.

10. The semiconductor structure of claim 9, wherein the conducting line portion is in contact with the first semiconductor layer.

11. The semiconductor structure of claim 1, wherein the first channel region further comprises a body region and a depletion region between the body region and the first drain region, and the conducting structure is spaced apart from the depletion region when the first transistor is at zero bias.

12. The semiconductor structure of claim 1, wherein the first semiconductor layer is spaced apart from the first insulation layer.

13. The semiconductor structure of claim 1 further comprising a second semiconductor layer, wherein the first insulation layer is between the first semiconductor layer and the second semiconductor layer.

14. The semiconductor structure of claim 1, wherein a thickness of the first semiconductor layer is in a range between 5 nm and 200 nm.

15. A method for making a semiconductor structure, comprising:

(a) providing a first structure comprising a first substrate, a first insulation layer on the first substrate, a dielectric layer disposed between the first substrate and the first insulation layer, and a conducting structure formed in the dielectric layer and in contact with the first substrate;

(b) providing a second structure comprising a second substrate;

(c) bonding the first structure on the second structure by the first insulation layer to form a bonded structure;

(d) removing a portion of the first substrate;

(e) forming a first transistor in the first substrate, the first transistor comprising a first source region, a first drain region, and a first channel region between the first source region and the first drain region, wherein the first source region and the first drain region are in contact with the dielectric layer, and the conducting structure is under the first channel region and spaced apart from the first drain region.

16. The method of claim 15, wherein the first substrate is a single crystalline substrate made of silicon, germanium, gallium arsenide (GaAs), indium phosphide (InP), silicon carbon (SiC), or gallium nitride (GaN).

17. The method of claim 15, wherein the conducting structure comprises metal and is in contact with the first substrate.

18. The method of claim 17, wherein the conducting structure is between the first insulation layer and the first substrate.

19. The method of claim 15, wherein the conducting structure comprises metal, and in the step (e) the conducting structure is in contact with the first source region.

20. The method of claim 15, wherein the step (a) comprises:

(a1) providing a first substrate;

(a2) implanting a hydrogen layer into the first substrate;

(a3) forming the conducting structure on the first substrate; and (a4) forming the first insulation layer on the conducting structure.

21. The method of claim 20, wherein the step (a4) comprises depositing the first insulation layer on the conducting structure.

22. The method of claim 15, wherein, in the step (d), the portion of the first substrate is removed by (1) heating the bonded structure at a first temperature, (2) cleaving the bonded structure by a mechanical pressure, or (3) quenching the bonded structure with liquid nitrogen.

23. The method of claim 15, wherein the step (e) further comprises polishing the top surface of the first substrate after removing a portion of the first substrate.

24. A method for making a semiconductor structure, comprising:

(a) providing a first structure, wherein the first structure comprises a first substrate, a second substrate, and a first insulation layer between the first substrate and the second substrate, the first substrate comprising a first transistor comprising a first source region, a first drain region, and a first channel region between the first source region and the first drain region;

(b) providing second structure comprising a third substrate;

(c) bonding the first structure on the second structure by a bonding layer to form a bonded structure, (d) removing the second substrate; and (e) forming a conducting structure in a dielectric layer and in contact with the first channel region in the first substrate and spaced apart from the first drain region, wherein the first source region and the first drain region are in contact with the dielectric layer.

25. The method of claim 24, wherein the conducting structure comprises metal, and in the step (e) the conducting structure is in contact with the first source region.

26. The method of claim 24, wherein the first structure further comprises interconnect structure over the first substrate, and in the step (c) the interconnect structure is between the first substrate and the third substrate in the bonded structure.

27. The method of claim 24, wherein the bonding layer is formed on the first structure before the step (c).

28. The method of claim 24, wherein the first structure is formed from a silicon-on-insulator (SOI) substrate, a silicon-metal-on-insulator (SMOI) substrate, a silicon-etch-stopper-on-insulator (SEOI), or a silicon-metal-etch-stopper-on-insulator (SMEOI) substrate.

29. The method of claim 24, wherein in the step (e) the conducting structure comprises metal and is in contact with the first substrate.

30. The method of claim 24, wherein the step (d) further comprises removing the first insulation layer.

31. The method of claim 24, wherein the conducting structure comprises metal, and the step (e) comprises forming the conducting structure on the first substrate.

32. The method of claim 31, wherein the step (e) further comprises patterning the first insulation layer and forming the conducting structure in the first insulation layer.

* * * * *